United States Patent
Saito et al.

(10) Patent No.: US 10,256,393 B2
(45) Date of Patent: Apr. 9, 2019

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Hiroshi Saito, Kawasaki (JP); Shunsuke Murakami, Sheffield (GB); Jumpei Hayashi, Yokohama (JP); Kanako Oshima, Tokyo (JP); Hidenori Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 259 days.

(21) Appl. No.: 15/120,934

(22) PCT Filed: Feb. 10, 2015

(86) PCT No.: PCT/JP2015/054192
§ 371 (c)(1),
(2) Date: Aug. 23, 2016

(87) PCT Pub. No.: WO2015/129507
PCT Pub. Date: Sep. 3, 2015

(65) Prior Publication Data
US 2016/0365502 A1    Dec. 15, 2016

(30) Foreign Application Priority Data
Feb. 25, 2014 (JP) ................. 2014-034611

(51) Int. Cl.
| | |
|---|---|
| *B06B 1/06* | (2006.01) |
| *B41J 2/14* | (2006.01) |
| *H02N 2/00* | (2006.01) |
| *H02N 2/10* | (2006.01) |
| *H02N 2/16* | (2006.01) |
| *H04N 1/00* | (2006.01) |
| *C04B 35/49* | (2006.01) |
| *G02B 27/00* | (2006.01) |
| *H01L 41/09* | (2006.01) |
| *H01L 41/18* | (2006.01) |
| *H04N 5/225* | (2006.01) |
| *C04B 35/468* | (2006.01) |
| *H01L 41/047* | (2006.01) |
| *H01L 41/083* | (2006.01) |
| *H01L 41/187* | (2006.01) |

(52) U.S. Cl.
CPC ............ *H01L 41/1871* (2013.01); *B06B 1/06* (2013.01); *B41J 2/14201* (2013.01); *C04B 35/4682* (2013.01); *C04B 35/49* (2013.01); *G02B 27/0006* (2013.01); *H01L 41/0471* (2013.01); *H01L 41/0477* (2013.01); *H01L 41/083* (2013.01); *H01L 41/0973* (2013.01); *H01L 41/18* (2013.01); *H02N 2/001* (2013.01); *H02N 2/106* (2013.01); *H02N 2/163* (2013.01); *C04B 2235/3203* (2013.01); *C04B 2235/3206* (2013.01); *C04B 2235/3208* (2013.01); *C04B 2235/3215* (2013.01); *C04B 2235/3236* (2013.01); *C04B 2235/3244* (2013.01); *C04B 2235/3248* (2013.01); *C04B 2235/3262* (2013.01); *C04B 2235/3281* (2013.01); *C04B 2235/3298* (2013.01); *C04B 2235/3409* (2013.01); *C04B 2235/3418* (2013.01); *C04B 2235/5445* (2013.01); *C04B 2235/77* (2013.01); *C04B 2235/785* (2013.01); *C04B 2235/786* (2013.01); *C04B 2235/79* (2013.01); *H04N 1/00909* (2013.01); *H04N 5/2253* (2013.01)

(58) Field of Classification Search
CPC .. H01L 41/1871; C04B 35/4682; C04B 35/49
See application file for complete search history.

(56) References Cited

FOREIGN PATENT DOCUMENTS

| | | |
|---|---|---|
| CN | 1622359 A | 6/2005 |
| CN | 101971381 A | 2/2011 |
| CN | 102194670 A | 9/2011 |
| EP | 2824094 * | 1/2015 |
| EP | 2824094 A1 | 1/2015 |

(Continued)

OTHER PUBLICATIONS

John G. Fisher, et al., Low-Temperature Sintering of Barium Calcium Zirconium Titanate Lead-Free Piezoelectric Ceramics, Journal of the Korean Ceramic Society, vol. 50, No. 2, pp. 157-162, Mar. 2013.

Effect of A-site Ca and B-site Zr substitution on dielectric properties and microstructure in tin-doped BaTiO3-CaTiO3 composites, Ceramics International, vol. 34, No. 8, pp. 1941-1948 (2008), Yoon et al.

*Primary Examiner* — C Melissa Koslow

(74) *Attorney, Agent, or Firm* — Canon U.S.A. Inc., IP Division

(57) ABSTRACT

There is provided a lead-free piezoelectric material having a satisfactory piezoelectric constant and mechanical quality factor in the range of device operating temperatures (from −30° C. to 50° C.). The piezoelectric material contains a main constituent containing a perovskite-type metal oxide expressed by the general formula $(Ba_{1-x}Ca_x)_a(Ti_{1-y}Zr_y)O_3$, where x, y and a satisfy the $0.030 \leq x < 0.090$, $0.030 \leq y \leq 0.080$, and $0.9860 \leq a \leq 1.0200$. The material also contains 0.040 to 0.500 part by weight of Mn, 0.042 to 0.850 part by weight of Bi, 0 to 0.028 part by weight of Li, 0.001 to 4.000 part by weight of a third sub-constituent including at least one of Si and B, and 0.001 to 4.000 parts by weight of Cu, each in terms of element relative to 100 parts by weight of the metal oxide.

27 Claims, 15 Drawing Sheets

(56) References Cited

FOREIGN PATENT DOCUMENTS

| JP | 2009-215111 A | 9/2009 |
| JP | 2010-120835 A | 6/2010 |
| WO | 2013/005701 A1 | 1/2013 |

\* cited by examiner

IN-PHASE

REVERSE PHASE

PIEZOELECTRIC MATERIAL, PIEZOELECTRIC ELEMENT, AND ELECTRONIC APPARATUS

CROSS-REFERENCE TO RELATED APPLICATIONS

This application is a National Stage filing of International Application No. PCT/JP2015/054192 filed Feb. 10, 2015, which claims the benefit of Japanese Patent Application No. 2014-034611, filed Feb. 25, 2014, the disclosures of each of which are hereby incorporated by reference herein in their entirety.

TECHNICAL FIELD

The present invention relates to a piezoelectric material, and specifically to a lead-free piezoelectric material. The present invention also relates to a piezoelectric element, a multilayer piezoelectric element, a liquid ejecting head, a liquid ejecting apparatus, an ultrasonic motor, an optical apparatus, a vibration unit, a dust removing unit, an image sensing apparatus and an electronic apparatus, each using the piezoelectric material.

BACKGROUND ART

Piezoelectric materials are typically $ABO_3$ perovskite-type metal oxides such as lead zirconate titanate (hereinafter referred to as PZT). PZT however contains lead in the A site of the perovskite structure thereof. This is an issue in terms of environment. Lead-free perovskite-type metal oxides are desired as piezoelectric materials.

Barium titanate has been known as a lead-free perovskite-type piezoelectric metal oxide. Also, in order to improve the characteristics of the lead-free perovskite-type piezoelectric material, barium titanate-based materials have been being developed.

In order to increase the piezoelectric constant of barium titanate at room temperature, PTL 1 discloses a barium titanate-based piezoelectric material in which Ca is substituted for part of the A site of barium titanate and Zr is substituted for part of the B site thereof. In order to increase the mechanical quality factor of barium titanate at room temperature, PTL 2 discloses a barium titanate-based piezoelectric material prepared by substituting Ca for part of the A site of barium titanate, and further adding Mn, Fe, or Cu to the Ca-substituted barium titanate.

CITATION LIST

Patent Literature

PTL 1 Japanese Patent Laid-Open No. 2009-215111
PTL 2 Japanese Patent Laid-Open No. 2010-120835

SUMMARY OF INVENTION

Technical Problem

The known piezoelectric materials, however, have low piezoelectric constants at high temperatures in the range of device operating temperatures (from −30° C. to 50° C.), and low mechanical quality factors at low temperatures in the range of the device operating temperatures. The present invention provides a lead-free piezoelectric material having a satisfactory piezoelectric constant and mechanical quality factor in the range of device operating temperatures.

The present invention also provides a piezoelectric element, a multilayer piezoelectric element, a liquid ejecting head, a liquid ejecting apparatus, an ultrasonic motor, an optical apparatus, a vibration unit, a dust removing unit, an image sensing apparatus and an electronic apparatus, each using the lead-free piezoelectric material.

Solution to Problem

A piezoelectric material of an embodiment of the present invention contains a main constituent containing a perovskite-type metal oxide expressed by general formula (1): $(Ba_{1-x}Ca_x)_a(Ti_{1-y}Zr_y)O_3$ ($0.030 \leq x < 0.090$, $0.030 \leq y \leq 0.080$, $0.9860 \leq a \leq 1.0200$), a first sub-constituent composed of Mn, a second sub-constituent composed of Bi, or Bi and Li, a third sub-constituent including at least one of Si and B, and a fourth sub-constituent composed of Cu. The Mn content is in the range of 0.040 part by weight to 0.500 part by weight in terms of metal element relative to 100 parts by weight of the metal oxide. The Bi content is in the range of 0.042 part by weight to 0.850 part by weight in terms of metal element relative to 100 parts by weight of the metal oxide. The Li content is in the range of 0 parts by weight to 0.028 part by weight in terms of metal element relative to 100 parts by weight of the metal oxide. The content of the third sub-constituent is in the range of 0.001 part by weight to 4.000 parts by weight in terms of element relative to 100 parts by weight of the metal oxide. The Cu content is in the range of 0.001 part by weight to 4.000 parts by weight in terms of metal element relative to 100 parts by weight of the metal oxide.

A piezoelectric element according to an embodiment of the present invention includes a first electrode, a piezoelectric material portion, and a second electrode. The piezoelectric material portion is made of the piezoelectric material.

A multilayer piezoelectric element according to an embodiment of the present invention includes a plurality of piezoelectric material layers, each made of the piezoelectric material, and a plurality of electrode layers including at least one inner electrode. The piezoelectric material layers and the electrode layers are alternately stacked on each other.

A liquid ejecting head according to an embodiment of the present invention includes a liquid chamber provided with an vibration portion including the above-described piezoelectric element or multilayer piezoelectric element, and a portion defining an ejection opening communicating with the liquid chamber.

A liquid ejecting apparatus according to an embodiment of the present invention includes a portion on which a transfer medium is placed, and the liquid ejecting head.

An ultrasonic motor according to an embodiment of the present invention includes a vibration device including the piezoelectric element or the multilayer piezoelectric element, and a moving device in contact with the vibration device.

An optical apparatus according to an embodiment of the present invention includes a driving portion provided with the ultrasonic motor.

A vibration unit according to an embodiment of the present invention includes a vibration device including the piezoelectric element or the multilayer piezoelectric element, and a diaphragm on which the piezoelectric element or the multilayer piezoelectric element is disposed.

A dust removing unit according to an embodiment of the present invention includes a vibration portion provided with the vibration unit.

An image sensing apparatus according to an embodiment of the present invention includes a dust removing unit, and an image sensing element unit having a light-receiving face. The dust removing unit is disposed at the light receiving face of the image sensing element unit.

An electronic apparatus according to an embodiment of the present invention includes a piezoelectric acoustic component including the piezoelectric element or the multilayer piezoelectric element.

Further features of the present invention will become apparent from the following description of exemplary embodiments with reference to the attached drawings.

Advantageous Effects of Invention

The present invention provides a lead-free piezoelectric material having a satisfactory piezoelectric constant and mechanical quality factor in the range of device operating temperatures (from −30° C. to 50° C.). In particular, the present invention provides a piezoelectric material that can exhibit a much superior mechanical quality factor at low temperatures in the range of device operating temperatures.

The present invention also provides a piezoelectric element, a multilayer piezoelectric element, a liquid ejecting head, a liquid ejecting apparatus, an ultrasonic motor, an optical apparatus, a vibration unit, a dust removing unit, an image sensing apparatus and an electronic apparatus, each using the piezoelectric material.

DESCRIPTION OF EMBODIMENTS

Figure 1:
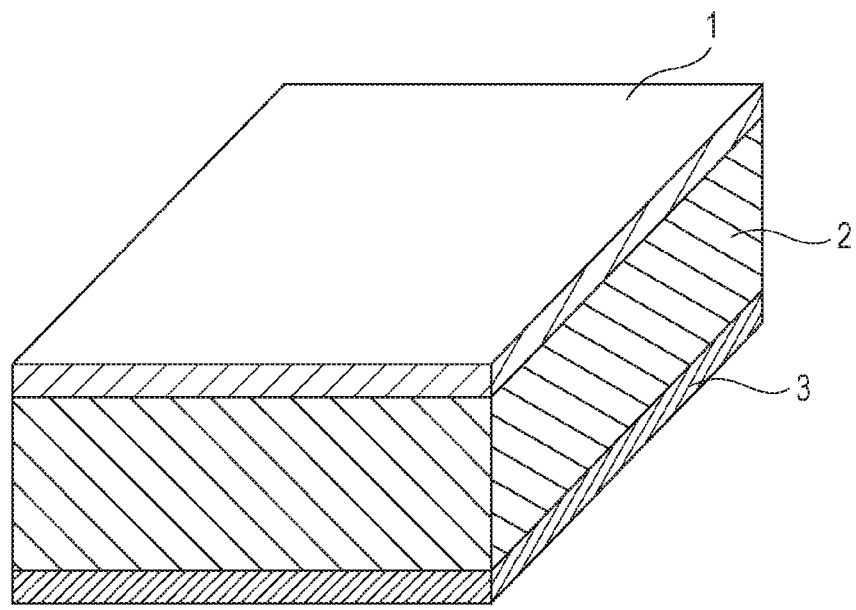
FIG. 1 is a schematic view of the structure of a piezoelectric element according to an embodiment of the present invention.

Some embodiments of the present invention will now be described.

A piezoelectric material contains a main constituent containing a perovskite-type metal oxide expressed by general formula (1): $(Ba_{1-x}Ca_x)_a(Ti_{1-y}Zr_y)O_3$ ($0.030 \leq x < 0.090$, $0.030 \leq y \leq 0.080$, $0.9860 \leq a \leq 1.0200$), a first sub-constituent composed of Mn, a second sub-constituent composed of Bi, or Bi and Li, a third sub-constituent including at least one of Si and B, and a fourth sub-constituent composed of Cu. The Mn content is in the range of 0.040 part by weight to 0.500 part by weight in terms of metal element relative to 100 parts by weight of the metal oxide. The Bi content is in the range of 0.042 part by weight to 0.850 part by weight in terms of metal element relative to 100 parts by weight of the metal oxide. The Li content is in the range of 0 parts by weight to 0.028 part by weight in terms of metal element relative to 100 parts by weight of the metal oxide. The content of the third sub-constituent is in the range of 0.001 part by weight to 4.000 parts by weight in terms of element relative to 100 parts by weight of the metal oxide. The Cu content is in the range of 0.001 part by weight to 4.000 parts by weight in terms of metal element relative to 100 parts by weight of the metal oxide.

Perovskite-Type Metal Oxide

The perovskite-type metal oxide mentioned herein refers to a metal oxide having a perovskite structure ideally in a cubic system, as described in Iwanami Dictionary of Physics and Chemistry, 5th edition (in Japanese, Iwanami Shoten Publishers, Feb. 20, 1998). Metal oxides having a perovskite structure is generally expressed as a formula $ABO_3$. The elements A and B in the perovskite structure are present in the form of ions in the A site and the B site, respectively. For example, in the case of a unit cell of a cubic system, element A lies at the vertexes of a cube and element B lies at the center of the cube. Element O lies at the centers of the faces of the cube in the form of negative oxygen ions.

General formula (1) of the metal oxide represents that Ba and Ca are present in the A site, while Ti and Zr are present in the B site. Part of Ba or Ca, however, may be present in the B site. Similarly, part of Ti or Zr may be present in the A site.

In general formula (1), the mole ratio of the elements in the B site to the oxygen (O) element is 1 to 3. Even if this ratio is slightly varied, the metal oxide is within the scope of the present invention as long as the main phase of the metal oxide has the perovskite structure.

It can be confirmed by crystal structure analysis by, for example, X-ray diffraction or electron diffraction that the metal oxide has a perovskite structure.

Main Constituent of the Piezoelectric Material

In the piezoelectric material of an embodiment of the present invention, the ratio a of the moles of Ba and Ca in the A site to the moles of Ti and Zr in the B site satisfies $0.9860 \leq a \leq 1.0200$. If a is less than 0.9860, the crystal grains of the piezoelectric material can grow abnormally and result in a reduced mechanical strength. In contrast, if a is higher than 1.0200, the temperature required to grow crystal grains increases excessively. This can make it difficult to sinter the material in a general furnace. "Make it difficult to sinter"

implies that the resulting piezoelectric material has pores or defects therein or does not have a sufficient density.

In general formula (1), the molar fraction x of the Ca in the A site satisfies 0.030≤x<0.090. If x is 0.090 or more, the device using the piezoelectric material cannot exhibit satisfactory piezoelectric properties at device operating temperatures. In contrast, if x is less than 0.030, the device cannot exhibit satisfactory mechanical quality factor at device operating temperatures.

In general formula (1), the molar fraction y of the Zr in the B site satisfies 0.030≤y≤0.080. If y is more than 0.080, the Curie temperature of the material decreases, and accordingly durability at high temperatures becomes insufficient. In contrast, if y is less than 0.030, the device using the piezoelectric material cannot exhibit satisfactory piezoelectric properties at device operating temperatures.

The term Curie temperature (Tc) mentioned herein refers to the temperature at which the ferroelectricity of the material is lost. In general, piezoelectric materials also lose piezoelectric properties at temperatures of Tc or more. For measuring the Curie temperature of a material, for example, the temperature at which the ferroelectricity of the material is lost may be directly measured with varying temperatures. Alternatively, the relative dielectric constant of the material may be measured with varying temperatures using a low alternating electric field, and the Curie temperature is obtained from the temperature at which the relative dielectric constant comes to the maximum.

The composition of the piezoelectric material of the present embodiment can be determined by any method without particular limitation. For example, X-ray fluorescence analysis, ICP emission spectroscopy, atomic absorption analysis, or the like can be applied. Any of these methods can derive the proportions of constituent elements on a weight basis and a mole basis.

First Sub-Constituent of the Piezoelectric Material

The sub-first constituent comprises Mn. The Mn content is in the range of 0.040 part by weight to 0.500 part by weight in terms of metal element relative to 100 parts by weight of the perovskite-type metal oxide.

In the description herein, the content of a sub-constituent in terms of metal element is the proportion of the weight of the sub-constituent to 100 parts by weight of the metal oxide expressed by general formula (1), converted from the total weight of the elements constituting the metal oxide measured by X-ray fluorescence analysis (XRF), ICP emission spectroscopy, atomic absorption analysis or the like.

When the piezoelectric material of the present embodiment contains Mn with the above content, the mechanical quality factor increases without reducing the piezoelectric constant over the range of device operating temperatures. The term mechanical quality factor of a piezoelectric material refers to a coefficient representing the elastic loss by vibration when the piezoelectric material is evaluated as a piezoelectric oscillator. The magnitude of the mechanical quality factor is defined by the sharpness of the resonance curve in impedance measurement. Hence, the mechanical quality factor is a constant representing the sharpness of the resonance of an oscillator. As the mechanical quality factor increases, the energy lost by oscillation decreases. By increasing the mechanical quality factor, piezoelectric elements using the piezoelectric material, which are driven by applying a voltage thereto, can operate reliably for a long time.

If the Mn content is less than 0.040 part by weight, the mechanical quality factor at device operating temperatures decreases to less than 400. If the piezoelectric material has a low mechanical quality factor, resonance devices including a piezoelectric element including the piezoelectric material and a pair of electrodes consume a large power in operation. Preferably, the mechanical quality factor is 400 or more, and more preferably 500 or more. Still more preferably, the mechanical quality factor is 600 or more. In these ranges, the power consumption of the device does not increase extremely in operation. In contrast, if the Mn content is higher than 0.500 part by weight, the insulation performance of the piezoelectric material decreases. For example, when an alternating voltage is applied to the piezoelectric material, the dielectric loss tangent can exceed 0.005 at a frequency of 1 kHz, or the resistivity can decrease below 1 GΩcm. Dielectric loss tangent can be measured with an impedance analyzer. A piezoelectric element using the piezoelectric material exhibiting a dielectric loss tangent of 0.005 or less can operate stably even if a high voltage is applied. A piezoelectric material can be polarized as long as the resistivity thereof is 1 GΩcm or more, and hence can be used as a piezoelectric element. Desirably, the resistivity is 50 GΩcm or more.

Second Sub-Constituent of the Piezoelectric Material

The second sub-constituent comprises Bi, or Bi and Li. The Bi content is in the range of 0.042 part by weight to 0.850 part by weight in terms of metal element relative to 100 parts by weight of the metal oxide, and the Li content is in the range of 0 parts by weight to 0.028 part by weight in terms of metal element relative to 100 parts by weight of the metal oxide.

When the piezoelectric material of the present embodiment contains Bi or Bi and Li with the above content, the mechanical quality factor increases greatly without reducing the piezoelectric constant at low temperatures. It is expected a large part of the trivalent Bi is present in the A site, and the rest of the Bi is present in the B site or the grain boundaries. When Bi is present in the A site, the piezoelectric material has a satisfactory mechanical quality factor even if the crystal structure is in a rhombic system. When Bi in the B site and the crystal structure is in a tetragonal system, a defect dipole is introduced because of the valence of Bi different from the valences (4) of Ti and Zr, thereby generating an internal electric field. Thus, even if the piezoelectric material is in either a rhombic system or a tetragonal system, the mechanical quality factor can be satisfactory. In other words, the presence of an appropriate amount of Bi in the piezoelectric material ensures a satisfactory mechanical quality factor at device operating temperatures. If the Bi content is less than 0.042 part by weight, the mechanical quality factor decreases to less than 400 at low temperatures (for example, at −30° C.) disadvantageously.

In contrast, if the Bi content is higher than 0.850 part by weight, the piezoelectric properties decrease undesirably. From the viewpoint of ensuring more satisfactory mechanical quality factor and piezoelectric constant at device operating temperatures (from −30° C. to 50° C.), the Bi content is preferably in the range of 0.100 part by weight to 0.850 part by weight. More preferably, the Bi content is in the range of 0.100 part by weight to 0.480 part by weight. In addition, if the Li content is increased to larger than 0.028 part by weight, the piezoelectric properties decrease undesirably. When the Li content is 0.028 part by weight or less, the material can be sintered at a lower temperature than the case of containing no Li, without degrading the piezoelectric properties. If the material is required to be fully sintered at a high temperature, Li is desirably not contained (or with a very low content of measurement limit or less).

The Bi in the piezoelectric material may be in any form without being limited to metallic Bi. For example, Bi may be dissolved as the solid solution of the A site or the B site, or may be contained in boundaries between the crystal grains (hereinafter referred to as grain boundaries). Alternatively, the Bi in the piezoelectric material may be in the form of metal, ion, an oxide, a metal salt or a complex, or any other form.

The Li in the piezoelectric material may be in any form without being limited to metallic Li. For example, Li may be dissolved as the solid solution of the A site or the B site, or may be contained in grain boundaries. Alternatively, the Li in the piezoelectric material may be in the form of metal, ion, an oxide, a metal salt or a complex, or any other form.

Third Sub-Constituent of the Piezoelectric Material

The piezoelectric material of the present embodiment further contains a third sub-constituent including at least one of Si and B. The content of the third sub-constituent is in the range of 0.001 part by weight to 4.000 parts by weight in terms of element relative to 100 parts by weight of the perovskite-type metal oxide. Preferably, the content of the third sub-constituent is in the range of 0.003 parts by mass to 2.000 parts by mass.

The third sub-constituent includes at least one of Si and B. B and Si are present in a segregated form in grain boundaries of the piezoelectric material. This reduces leakage current to increase the resistivity of the piezoelectric material. When the piezoelectric material contains 0.001 part by weight or more of the third sub-constituent, the insulation performance of the piezoelectric material increases advantageously. If the piezoelectric material contains more than 4.000 parts by weight of the third sub-constituent, the dielectric constant decreases to degrade the piezoelectric properties disadvantageously. Preferably, the Si content is in the range of 0.003 part by weight to 1.000 part by weight relative to 100 parts by weight of the perovskite-type metal oxide. More preferably, it is in the range of 0.001 part by weight to 1.000 part by weight.

In a multilayer piezoelectric element, in general, layers of the piezoelectric material between electrodes are thin. Accordingly, the piezoelectric material is required to be resistant to high electric fields. Since the piezoelectric material of the present embodiment is particularly superior in insulation performance, it can be advantageously used in multilayer piezoelectric elements.

Fourth Sub-Constituent of the Piezoelectric Material

The piezoelectric material of the present embodiment further contains a fourth sub-constituent composed of Cu. The Cu content is in the range of 0.001 part by weight to 4.000 parts by weight in terms of metal element relative to 100 parts by weight of the perovskite-type metal oxide. Preferably, the Cu content is in the range of 0.003 part by weight to 2.000 parts by weight.

The Cu may be dissolved as a solid solution in the crystal grains to increase the resistivity, thus advantageously increasing insulation performance.

In a multilayer piezoelectric element, in general, layers of the piezoelectric material between electrodes are thin. Accordingly, the piezoelectric material is required to be resistant to high electric fields. Since the piezoelectric material of the present embodiment is particularly superior in insulation performance, it can be advantageously used in multilayer piezoelectric elements.

Since a high resistivity leads to a reduced dielectric loss tangent, the piezoelectric element can operate stably even in a high electric field.

Fifth Sub-Constituent of the Piezoelectric Material

The piezoelectric material of the present embodiment may further contain a fifth sub-constituent composed of Mg. The Mg content is preferably in the range of more than 0 parts by weight to 0.50 part by weight, more preferably in the range of more than 0 parts by weight to 0.10 part by weight, in terms of metal element relative to 100 parts by weight of the perovskite-type metal oxide. In particular, the piezoelectric material containing Mg with a content in the range of more than 0 parts by weight to 0.10 part by weight in terms of metal element exhibits an increased mechanical quality factor.

If the Mg content is higher than 0.10 part by weight, however, the mechanical quality factor decreases to less than 400 at a temperature in the range of device operating temperatures. If the piezoelectric material has a low mechanical quality factor, a resonance device including a piezoelectric element using the piezoelectric material consumes a large power in operation. Preferably, the mechanical quality factor is 500 or more, and more preferably 600 or more. From the viewpoint of ensuring a more satisfactory mechanical quality factor, the Mg content is desirably 0.05 part by weight or less.

The Mg in the piezoelectric material may be in any form without being limited to metallic Mg. For example, Mg may be dissolved as the solid solution of the A site or the B site, or may be contained in grain boundaries. Alternatively, the Mg in the piezoelectric material may be in the form of metal, ion, an oxide, a metal salt or a complex, or any other form.

The piezoelectric material of the present embodiment may contain Nb to such an extent that commercially available Ti raw materials inevitably contain, or Hf to such an extent that commercially available Zr raw materials inevitably contain.

In the piezoelectric material of the present embodiment, the total amount of the perovskite-type metal oxide expressed by formula (1), the first sub-constituent, the second sub-constituent, the third sub-constituent, the fourth sub-constituent and the fifth sub-constituent is preferably 98.5% by mole or more. In addition, the content of the main constituent or perovskite-type metal oxide expressed by formula (1) is preferably 90% by mole or more. More preferably, it is 95% by mole or more.

Grain Size and Equivalent Circular Diameter of Crystal Grains

In the present embodiment, the crystal grains of the piezoelectric material may have an average equivalent circular diameter in the range of 0.5 μm to 10 μm. The term average equivalent circular diameter refers to the average of the equivalent circular diameters of a plurality of crystal grains. When the average equivalent circular diameter of the crystal grains is in this range, the piezoelectric material can exhibit satisfactory piezoelectric properties and mechanical strength. If the average equivalent circular diameter is less than 0.5 μm, the piezoelectric properties of the piezoelectric material can be poor. In contrast, if it is larger than 10 μm, the mechanical strength can decrease undesirably. Advantageously, the average equivalent circular diameter is in the range of 0.5 μm to 4.5 μm.

The term "equivalent circular diameter" used herein refers to "projected area-equivalent circular diameter", which is the diameter of a circle with an area equivalent to the projected area of a grain when measured through a microscope. In the present embodiment, the equivalent circular diameter may be measured by any method without particular limitation. For the measurement, for example, the surface of the piezoelectric material may be photographed through a polarizing microscope or an electron microscope, and the image of the photograph is processed. An optical microscope and an electron microscope may be selectively used depending on the grain size. The equivalent circular diameter may be obtained using not the top surface of the piezoelectric material, but a polished surface or section of a body of the piezoelectric material.

Relative Density

The piezoelectric material of the present embodiment may have a relative density in the range of 92% to 100%, and desirably in the range of 93% to 100%.

Relative density is the ratio of the measured density of a piezoelectric material to the theoretical density calculated using the lattice constant of the piezoelectric material and the atomic weights of the elements in the piezoelectric material. The lattice constant can be measured by, for example, X-ray diffraction analysis. The density can be measured by, for example, Archimedian method.

If the relative density of the piezoelectric material is lower than 93%, which is in the above mentioned desired range, the piezoelectric properties or the mechanical quality factor can be poor, or the mechanical strength can decrease.

Preferably, the relative density of the piezoelectric material is in the range of 95% to 100%, more preferably in the range of 97% to 100%.

Production Method of the Piezoelectric Material

A method for producing the piezoelectric material will now be described, but is not limited to the disclosed method.

Raw Materials of the Piezoelectric Material

For producing the piezoelectric material, a known process may be applied in which a compact is formed using solid powder of oxides, carbonates, nitrates, oxalates or the like containing the constituent elements. Then the compact is sintered under normal pressure. The raw materials include metal compounds including a Ba compound, a Ca compound, a Ti compound, a Zr compound, a Mn compound, a Bi compound, a Li compound, a Mg compound, a Cu compound, a B compound, and a Si compound.

Ba compounds used as the raw material include barium oxide, barium carbonate, barium oxalate, barium acetate, barium nitrate, barium titanate, barium zirconate, barium stannate, and barium titanate zirconate. A commercially available, highly pure product (having a purity of 99.99% or more) of these Ba compounds is advantageous.

Ca compounds used as the raw material include calcium oxide, calcium carbonate, calcium oxalate, calcium acetate, calcium titanate, calcium zirconate, and calcium stannate. A commercially available, highly pure product (having a purity of 99.99% or more) of these Ca compounds is advantageous.

Ti compounds used as the raw material include titanium oxide, barium titanate, barium titanate zirconate, and calcium titanate. If a Ti compound containing an alkaline-earth metal, such as barium or calcium, is used, a commercially available, highly pure compound (having a purity of 99.99% or more) is advantageous.

Zr compounds used as the raw material include zirconium oxide, barium zirconate, barium titanate zirconate, and calcium zirconate. If a Zr compound containing an alkaline-earth metal, such as barium or calcium, is used, a commercially available, highly pure compound (having a purity of 99.99% or more) is advantageous.

Mn compounds used as the raw material include manganese carbonate, manganese oxide, manganese dioxide, manganese acetate, and trimanganese tetraoxide.

Bi compounds used as the raw material include bismuth oxide and lithium bismuthate.

Li compounds used as the raw material include lithium carbonate and lithium bismuthate.

An exemplary Si compound may be silicon dioxide.

An exemplary B compound may be boron oxide.

Cu compounds used as the raw material include copper (I) oxide, copper (II) oxide, copper carbonate, copper (II) acetate, and copper oxalate.

Mg compounds uses as the raw material include magnesium carbonate, magnesium oxide, magnesium hydroxide, magnesium peroxide, and magnesium chloride.

The material added to control the ratio a of the moles of Ba and Ca in the A site to the moles of Ti and Zr in the B site is not particularly limited. Any compound of Ba compounds, Ca compounds, Ti compounds and Zr compounds can produce the same effect.

Granulated Powder and Compact

The compact is a solid material formed by compacting solid powders. For compacting the powders, uniaxial pressing, cold isostatic pressing, hot isostatic processing, casting, or extrusion may be applied. For forming the compact, granulated powder is advantageously used. When a compact of granulated powder is sintered, the sintered compact tends to have a uniform grain size.

Although the granulation of the raw material powders of the piezoelectric material is not particularly limited, a spray dry process is advantageous for forming granulated powder having a uniform particle size.

A binder, such as polyvinyl alcohol (PVA), polyvinyl butyral (PVB), or acrylic resin, may be used for granulation. The binder may be added in a proportion of 1 part by weight to 10 parts by weight relative to 100 parts by weight of the raw material powders of the piezoelectric material. From the viewpoint of increasing the density of the compact, the proportion of the binder may be in the range of 2 parts by weight to 5 parts by weight.

Sintering

The compact may be sintered in any process without particular limitation.

For example, the compact may be sintered in an electric furnace or a gas furnace, or by being energized for heating, using microwaves or millimeter waves, hot isostatic press (HIP), or any other technique. Sintering in an electric furnace or a gas furnace may be performed in a continuous or batch furnace.

The sintering is desirably performed at, but not limited to, a temperature at which compounds react to sufficiently grow crystals. The sintering temperature is preferably in the range of 1100° C. to 1250° C., more preferably 1150° C. to 1200° C., from the viewpoint of controlling the grain size in the range of 0.5 μm to 10 μm. The piezoelectric material sintered at a temperature in such a range exhibits good piezoelectric performance. In order to stabilize the properties of the sintered piezoelectric material with high reproducibility, the sintering is performed at a constant temperature in the above range for 2 to 48 hours. Although two-stage sintering or the like may be applied, it is advantageous in view of productivity to avoid rapid temperature changes.

The sintered piezoelectric material may be heat-treated at 1000° C. or more after being polished. Mechanical polishing produces residual stress in the piezoelectric material. By heat-treating the polished piezoelectric material at 1000° C. or more, however, the residual stress is relieved to improve the piezoelectric properties. In addition, barium carbonate or other raw material powders precipitated at grain boundaries can be removed by the heat treatment. Heat treatment time may be, but is not limited to, 1 hour or more.

Piezoelectric Element

FIG. 1 is a schematic view of the structure of a piezoelectric element according to an embodiment of the present invention. The piezoelectric element of the present embodiment includes a first electrode 1, a piezoelectric material portion 2, and a second electrode 3. The piezoelectric material of the piezoelectric material portion 2 is the piezoelectric material of an embodiment of the invention.

The piezoelectric properties of the piezoelectric material can be estimated in the form of an piezoelectric element having the first and second electrodes. The first and second electrodes are each defined by an electroconductive layer having a thickness of about 5 nm to 10 µm. The material of the electrodes is not particularly limited as long as it is generally used in electrodes of known piezoelectric elements. Exemplary electrode materials include metals, such as Ti, Pt, Ta, Ir, Sr, In, Sn, Au, Al, Fe, Cr, Ni, Pd, Ag, and Cu, and compounds of these metals.

The first and second electrodes may be made of one of these metals or may be a multilayer composite made of two or more of these metals. The first electrode and the second electrode may be made of different materials from each other.

The first and second electrodes can be formed by any method without particular limitation. For example, the electrodes may be formed by baking a metal paste, or by sputtering or vapor deposition. Also, the first and second electrodes may be formed in a desired pattern.

Polarization

In the piezoelectric element in a more advantageous embodiment, the polarization axes are aligned in a direction. By aligning the polarization axes in the same direction, the piezoelectric constant of the element is increased.

The piezoelectric element may be polarized in any method without particular limitation. For example, polarization may be performed in the air or in silicone oil. Although polarization temperature can be in the range of 60° C. to 150° C., suitable polarization conditions are varied to some extent depending on the composition of the piezoelectric material of the piezoelectric element. The electric field applied for polarization may be 8 kV/cm to 20 kV/cm.

Measurements of Piezoelectric Constant and Mechanical Quality Factor

The piezoelectric constant and mechanical quality factor of the piezoelectric material can be determined by calculation using the measurements of resonant frequency and anti-resonant frequency measured with a commercially available impedance analyzer in accordance with a standard (JEITA EM-4501) of Japan Electronics and Information Technology Industries Association. This method is called resonance-anti-resonance method.

Multilayer Piezoelectric Element

A multilayer piezoelectric element of an embodiment of the present invention will now be described.

The multilayer piezoelectric element of an embodiment includes a plurality of piezoelectric material layers, each made of the piezoelectric material of an embodiment of the present invention, and a plurality of electrode layers including at least one inner electrode. The piezoelectric material layers and the electrode layers are alternately stacked on each other.

Figure 2A:
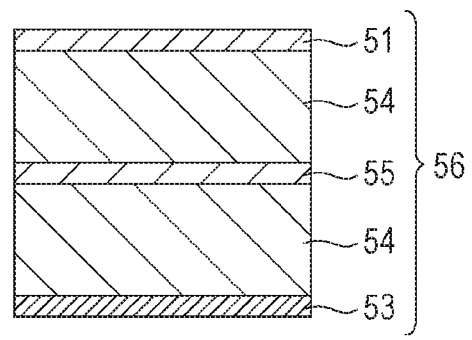
FIGS. 2A and 2B are schematic sectional views of the structures each of a multilayer piezoelectric element according to an embodiment of the present invention.
Figure 2B:
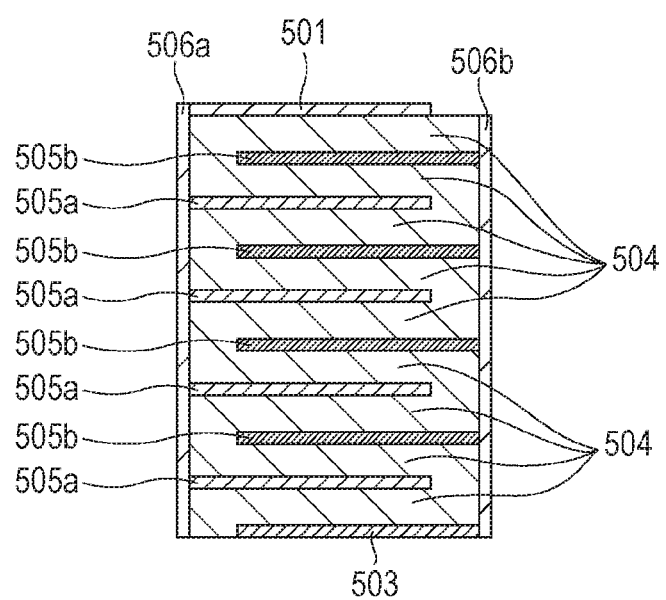

FIGS. 2A and 2B are schematic sectional views each of the structure of a multilayer piezoelectric element according to an embodiment of the present invention. The multilayer piezoelectric element of the present embodiment includes piezoelectric material layers 54, each made of the piezoelectric material of an embodiment of the present invention, and electrode layers including at least one inner electrode 55. The piezoelectric material layers 54 and the electrode layers are alternately stacked on each other. The electrode layers may include a first electrode 51 and a second electrode 53 in addition to the inner electrode 55.

FIG. 2A shows a multilayer piezoelectric element 56 including a multilayer structure including two piezoelectric material layers 54 with one inner electrode 55 therebetween, and a first electrode 51 and a second electrode 53 separated by the multilayer structure. The multilayer piezoelectric element may have a structure having larger numbers of piezoelectric layers and inner electrodes, as shown in FIG. 2B. The numbers of these layers are not limited. The multilayer element shown in FIG. 2B includes a multilayer structure including 9 piezoelectric material layers 504 and 8 inner electrodes 505 (505a and 505b) that are alternately stacked on each other, and the multilayer structure is disposed between a first electrode 501 and a second electrode 503. External electrodes 506a and 506b are also provided for electrically connecting the inner electrodes.

The inner electrode 55 or 505, external electrodes 506a and 506b and 501, and the second electrode 53 or 503 do not necessarily have the same dimensions or shapes as the piezoelectric material layers 54 or 504, and each electrode may be divided into several portions.

The inner electrode 55 or 505, the external electrodes 506a and 506b, the first electrode 51 or 501, and the second electrode 53 or 503 are each defined by an electroconductive layer having a thickness of about 5 nm to 10 µm. The material of the electrodes is not particularly limited as long as it is generally used in electrodes of known piezoelectric elements. Exemplary electrode materials include metals, such as Ti, Pt, Ta, Ir, Sr, In, Sn, Au, Al, Fe, Cr, Ni, Pd, Ag, and Cu, and compounds of these metals. The inner electrodes 55 and 505 and the external electrodes 506a and 506b may be made of one of these metals or may have a multilayer structure made of two or more of these metals. The electrodes may be made of different materials from each other.

The inner electrodes 55 and 505 may contain Ag with a content M1 on a weight basis and Pd with a content M2 on a weight basis, and the ratio of the Ag content M1 to the Pd content M2 may satisfy the relationship $0.25 \leq M1/M2 \leq 4.0$. Preferably, $2.3 \leq M1/M2 \leq 4.0$ holds true. If the M1/M2 ratio is less than 0.25, the sintering temperature of the inner electrode increases. In contrast, if the M1/M2 ratio is larger than 4.0, the inner electrode is formed undesirably in an island manner with in-plane nonuniformity.

In view of material cost, it is advantageous that the inner electrode 55 or 505 is made of at least one of Ni and Cu. When the inner electrode 55 or 505 is made of at least one of Ni and Cu, the firing of the multilayer piezoelectric element is performed desirably in a reducing atmosphere.

The plurality of electrodes including the inner electrodes 505, as shown in FIG. 2B, may be electrically connected to align the phases of the driving voltage. For example, inner electrodes 505a and the first electrode 501 are electrically connected with external electrode 506a. Similarly, inner electrodes 505b and the second electrode 503 are electrically connected with external electrode 506b. Inner electrodes 505a and inner electrodes 505b may be alternately disposed. It is not limited how the electrodes are electrically connected. Electrodes or conducting lines may be provided at the sides of the multilayer piezoelectric element for electrically connecting the electrodes, or a through hole passing through the piezoelectric material layers 504 may be formed and which is filled with an electroconductive material to electrically connect the electrodes.

Liquid Ejecting Head

A liquid ejecting head according to an embodiment will now be described.

The liquid ejecting head of the present embodiment includes a liquid chamber provided with an vibration portion including the above-described piezoelectric element or multilayer piezoelectric element, and a portion defining an ejection opening communicating with the liquid chamber.

Figure 3A:
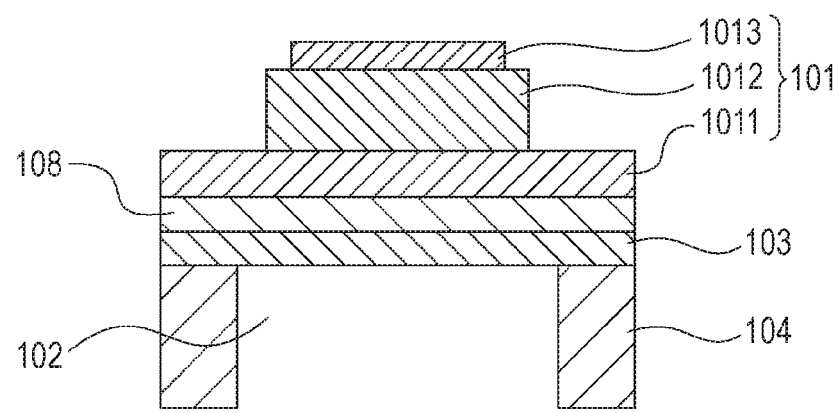
FIGS. 3A and 3B are schematic views of a liquid ejecting head according to an embodiment of the present invention.
Figure 3B:
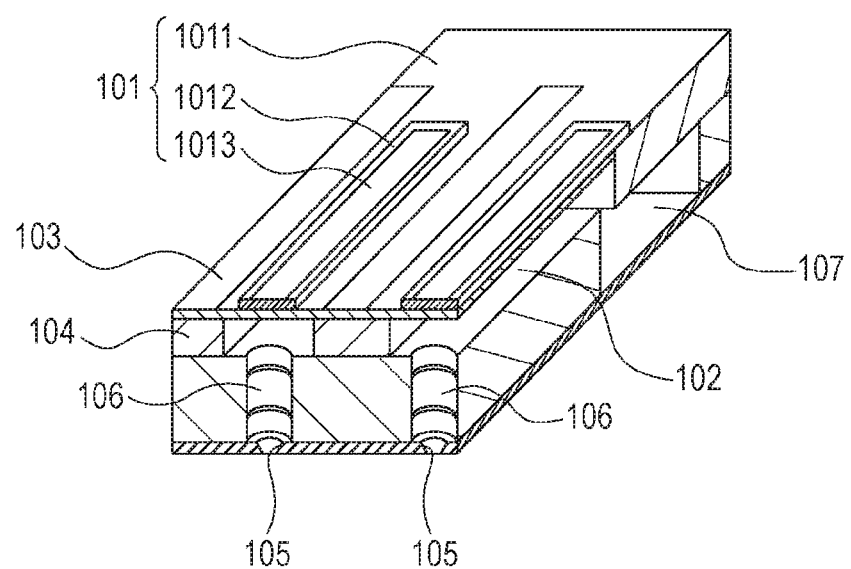

FIGS. 3A and 3B are schematic views of a liquid ejection head according to an embodiment of the present invention. As shown in FIGS. 3A and 3B, the liquid ejecting head includes piezoelectric elements 101. Each of the piezoelectric elements 101 includes a first electrode 1011, a piezoelectric material portion 1012 made of a piezoelectric material, and a second electrode 1013. The piezoelectric material portion 1012 is formed in a pattern as shown in FIG. 3B as needed.

FIG. 3B schematically shows the liquid ejecting head. The liquid ejecting head has ejection openings 105, discrete liquid chambers 102, communication holes 106 communicating between the discrete liquid chambers 102 and the corresponding ejection openings 105, liquid chamber partitions 104, a common liquid chamber 107, a diaphragm 103, and the piezoelectric elements 101. Although the shape of the piezoelectric element 101 shown in FIG. 3B is rectangular, the piezoelectric element 101 may have any shape, such as oval, circle or parallelogram. In general, the piezoelectric material portion 1012 has a shape corresponding to the shape of the discrete liquid chamber 102.

The piezoelectric element 101 and its vicinity of the liquid ejecting head will be described with reference to FIG. 3A. FIG. 3A is a sectional view of the piezoelectric element shown in FIG. 3B taken in the width direction thereof. Although the piezoelectric element 101 shown in FIG. 3A has a rectangular section, the section may be of trapezoid or inverted trapezoid.

In FIG. 3A, the first electrode 1011 is the lower electrode, and the second electrode 1013 is the upper electrode. The arrangement of the first and second electrodes 1011 and 1013 is however not limited to that shown in the figure. For example, the first electrode 1011 may be used as the lower electrode or the upper electrode. Similarly, the second electrode 1013 may be used as the upper electrode or the lower electrode. A buffer layer 108 may be provided between the diaphragm 103 and the lower electrode. The upper and lower electrodes are named depending on the manufacturing process of the device. The piezoelectric element produces the same effect irrespective of what those electrodes are called.

The diaphragm 103 is vertically vibrated by the expansion and contraction of the piezoelectric material portion 1012, thereby applying a pressure to a liquid in the corresponding discrete liquid chamber 102. Consequently, the liquid is ejected through the ejection opening 105. The liquid ejecting head of the present embodiment can be used in a printer or for manufacturing electronic devices.

The diaphragm 103 has a thickness in the range of 1.0 µm to 15 µm, preferably in the range of 1.5 µm to 8 µm. The material of the diaphragm 103 may be, but is not limited to, Si. The Si of the diaphragm 103 may be doped with boron or phosphorus. The buffer layer or electrode on the diaphragm 103 may act as a part of the diaphragm 103. The buffer layer 108 has a thickness in the range of 5 nm to 300 nm, preferably in the range of 10 nm to 200 nm. The ejection opening 105 is defined by a hole formed in a nozzle plate (not shown). The thickness of the nozzle plate may be in the range of 30 µm to 150 µm. The ejection opening 105 has an equivalent circle diameter in the range of 5 µm to 40 µm. The shape of the ejection opening 105 may be circular, star-like or triangular.

Liquid Ejecting Apparatus

A liquid ejecting apparatus according to an embodiment will now be described. A liquid ejecting apparatus according to an embodiment of the present invention includes a portion on which a transfer medium is placed, and the above-described liquid ejecting head.

Figure 4:
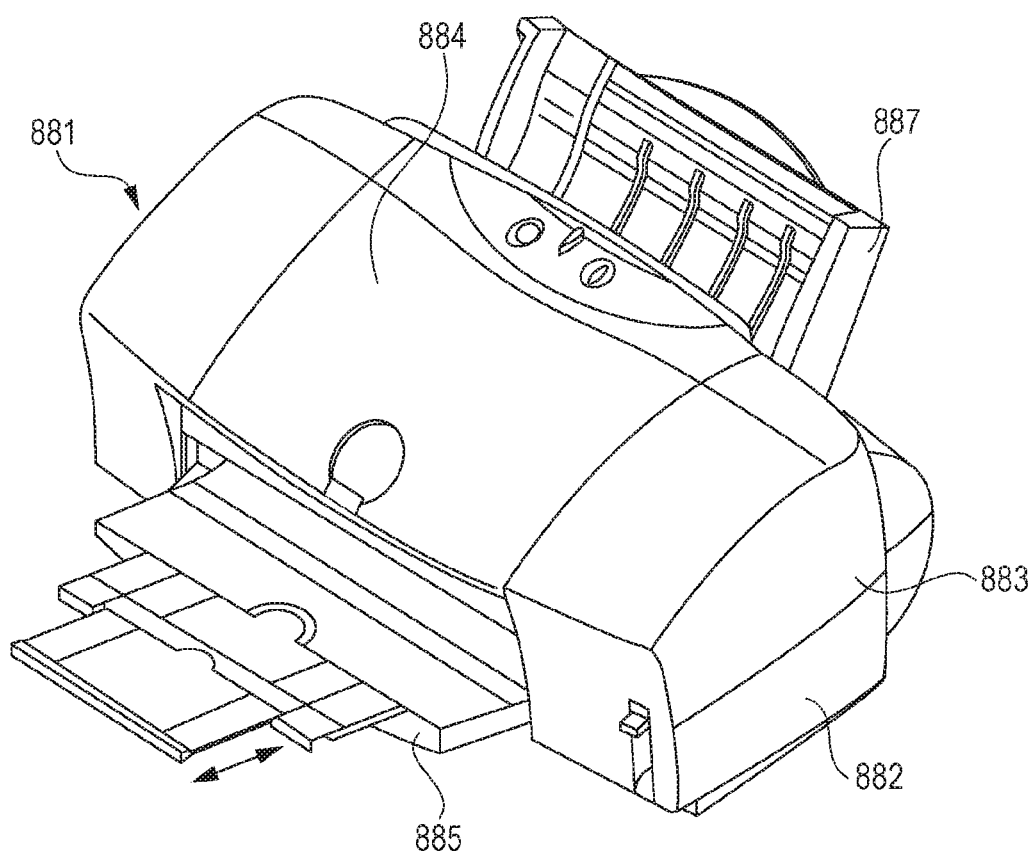
FIG. 4 is a schematic view of a liquid ejecting apparatus according to an embodiment of the present invention.
Figure 5:
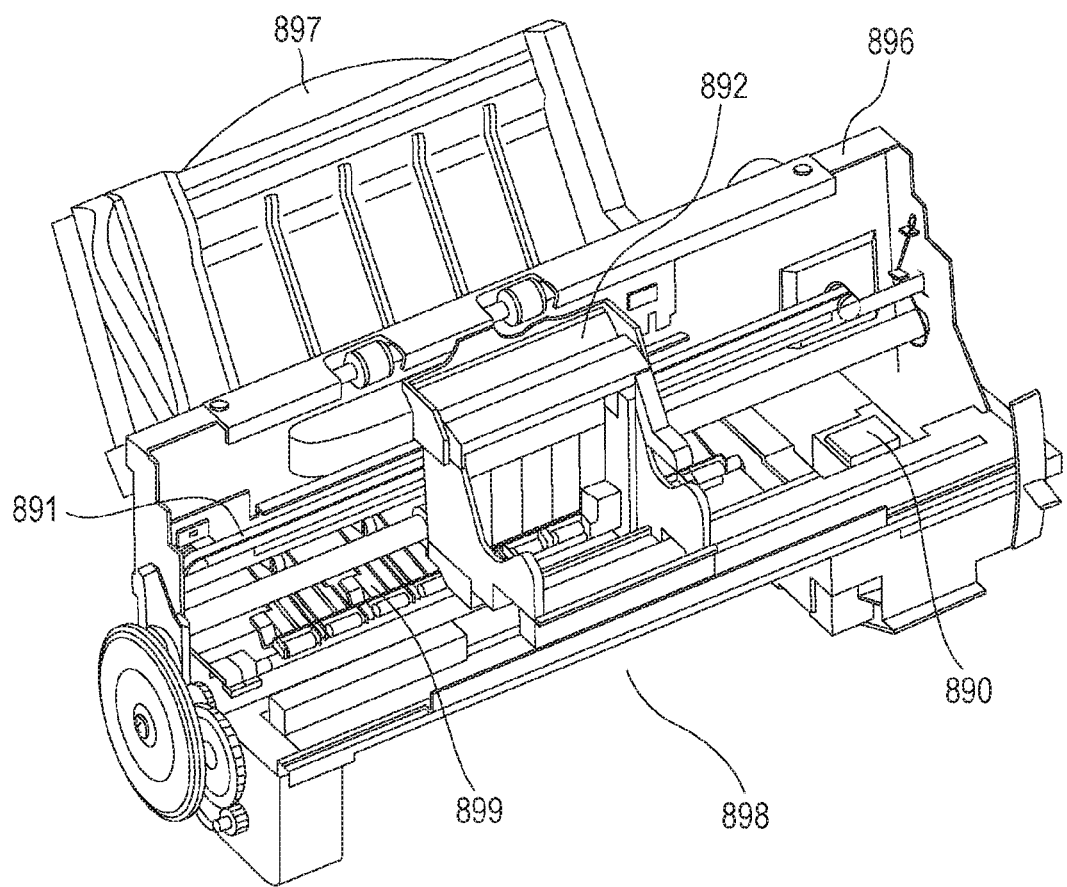
FIG. 5 is a schematic view of a liquid ejecting apparatus according to an embodiment of the present invention.

The liquid ejecting apparatus may be an ink jet recording apparatus as shown in FIGS. 4 and 5. FIG. 5 shows ink jet recording apparatus (the liquid ejecting apparatus) 881 shown in FIG. 4 in a state where the external members 882 to 885 and 887 are removed therefrom. The ink jet recording apparatus 881 includes an automatic feeding section 897 that feeds recording paper, which is a transfer medium, into the body 896 thereof. The ink jet recording apparatus 881 further includes three portions that guide the recording paper fed from the automatic feeding section 897 to a predetermined recording position and then to an ejection port 898. More specifically, the ink jet recording apparatus 881 has a conveying section 899 on which the transfer medium is placed, a recording section 891 where recording is performed on the recording paper conveyed to the recording position, and a recovering section 890 that recovers the recording section 891. The recording section 891 contains a liquid ejecting head of an embodiment of the present invention, and is provided with a carriage 892 that reciprocally moves on a rail.

In this ink jet recording apparatus, the carriage 892 is moved on the rail according to electrical signals transmitted from a computer, and the piezoelectric material portion is displaced by applying a driving voltage to the electrodes between which the piezoelectric material portion is disposed. The displacement of the piezoelectric material portion applies a pressure to the discrete liquid chamber 102 via the diaphragm 103 shown in FIG. 3B, thereby ejecting the ink through the ejection opening 105 for printing.

The liquid ejecting apparatus of the present embodiment can evenly eject liquid at high speed and can be downsized.

Although the present embodiment illustrates a printer by way of example, the liquid ejecting apparatus may be used as a printing machine such as a facsimile, a multifunctional printer, a copy machine or any other ink jet recording apparatus, or an industrial liquid ejecting apparatus or a plotting and graphing apparatus.

Also, the user can select a transfer medium suitable for use. The liquid ejecting apparatus may have the structure in which the liquid ejecting head moves relative to a transfer medium on a stage.

Ultrasonic Motor

An ultrasonic motor of an embodiment of the present invention will now be described. An ultrasonic motor according to an embodiment includes a vibration device including a piezoelectric element or multilayer piezoelectric element according to an embodiment of the invention, and a moving device in contact with the vibration device.

Figure 6A:
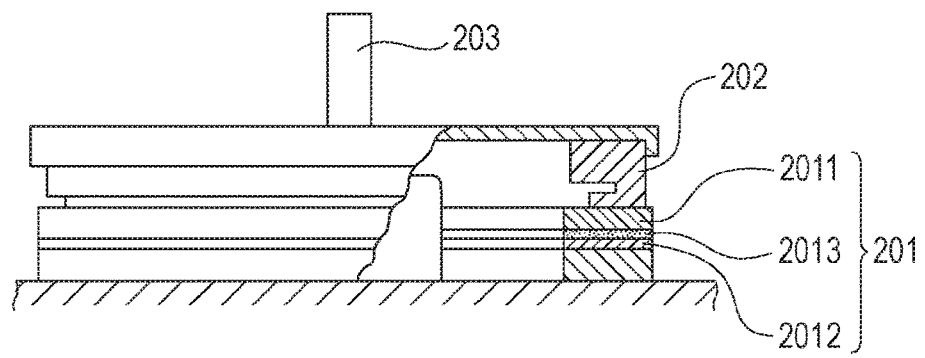
FIGS. 6A and 6B are each a schematic view of an ultrasonic motor according to an embodiment of the present invention.
Figure 6B:
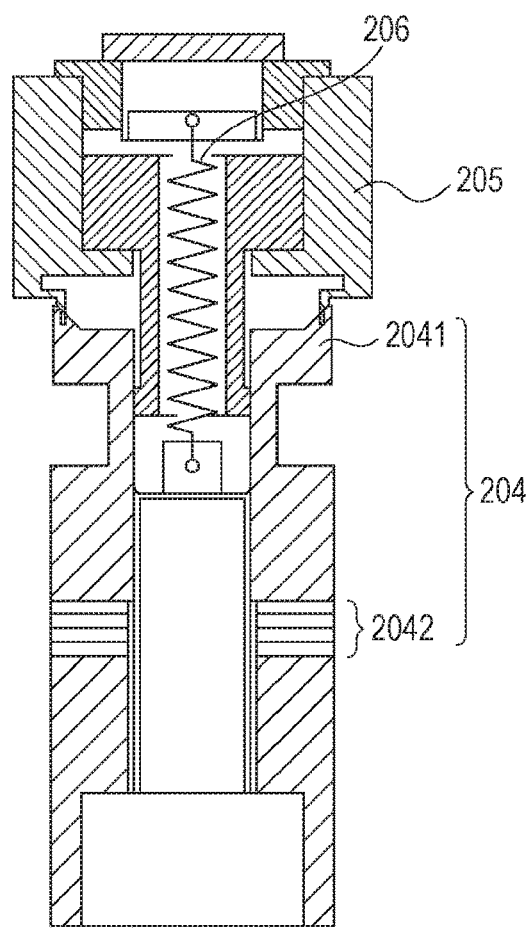

FIGS. 6A and 6B are each a schematic view of an ultrasonic motor according to an embodiment of the present invention. FIG. 6A shows an ultrasonic motor including a single-plate piezoelectric element. The ultrasonic motor includes an oscillator 201, a rotor 202 in contact with a sliding surface of the oscillator 201 with a pressure applied by a pressuring spring (not shown), and an output shaft 203 integrated with the rotor 202. The oscillator 201 includes a metal elastic ring 2011, a piezoelectric element 2012 according to an embodiment of the present invention, and an organic adhesive 2013 (for example, epoxy or cyanoacrylate adhesive) bonding the piezoelectric element 2012 to the elastic ring 2011. The piezoelectric element 2012 includes a first and a second electrode (not shown) and a piezoelectric material portion between the first and second electrodes.

When two-phase alternating voltages having different phases by an odd multiple of $\pi/2$ is applied to the piezoelectric element, the oscillator 201 generates flexural traveling waves, and each point on the sliding surface of the oscillator 201 moves elliptically. If the rotor 202 is in contact with the sliding surface of the oscillator 201 with pressure applied, the rotor 202 is rotated in the direction opposite to the direction of the flexural traveling waves by receiving a frictional force from the oscillator 201. A driven body (not shown) joined to the output shaft 203 is driven by the rotation of the rotor 202. When a voltage is applied to the piezoelectric material portion, the piezoelectric material portion is expanded and contracted by the piezoelectric effect. If the piezoelectric material portion is in contact with a metal or any other elastic material, the elastic material is bent by the expansion and contraction of the piezoelectric material portion. The ultrasonic motor of the present embodiment is based on this principle.

FIG. 6B shows an ultrasonic motor including a piezoelectric element having a multilayer structure. The oscillator 204 of this ultrasonic motor includes a multilayer piezoelectric element 2042 disposed in a cylindrical metal elastic member 2041. The multilayer piezoelectric element 2042 includes a plurality of piezoelectric material portions (not shown) made of a piezoelectric material, a first and a second electrode disposed on both surfaces of the multilayer structure of the piezoelectric material portions, and at least one inner electrode disposed in the multilayer structure. The metal elastic member 2041 is connected with a bolt so as to secure the piezoelectric element 2042 therein, thus constituting the oscillator 204.

When alternating voltages having different phases are applied to the multilayer piezoelectric element 2042, the oscillator 204 generates two vibrations in orthogonal directions. The two vibrations are synthesized into a circular vibration that drives the top end of the oscillator 204. The oscillator 204 is provided with a circumferential groove at an upper portion thereof to increase the displacement of the driving vibration. The rotor 205 is in contact with the oscillator 204 with a pressure applied by pressuring spring 206 and thus generates a frictional force for driving. The rotor 205 is rotatably held in a bearing.

Optical Apparatus

An optical apparatus according to an embodiment will now be described. The optical apparatus includes a driving portion provided with the above-described ultrasonic motor.

Figure 7A:
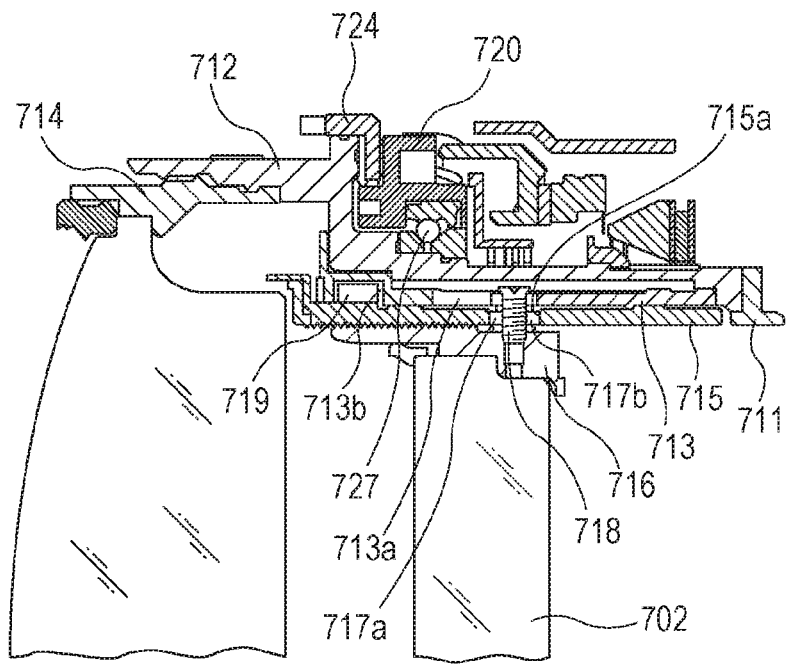
FIGS. 7A and 7B are schematic views of an optical apparatus according to an embodiment of the present invention.
Figure 7B:
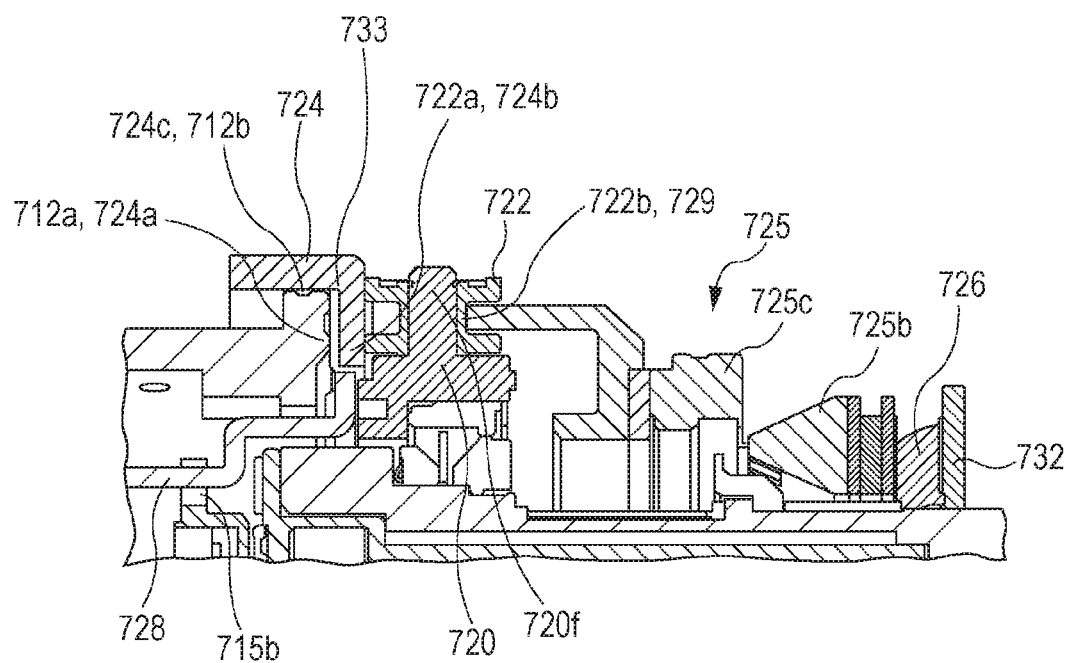
Figure 8:
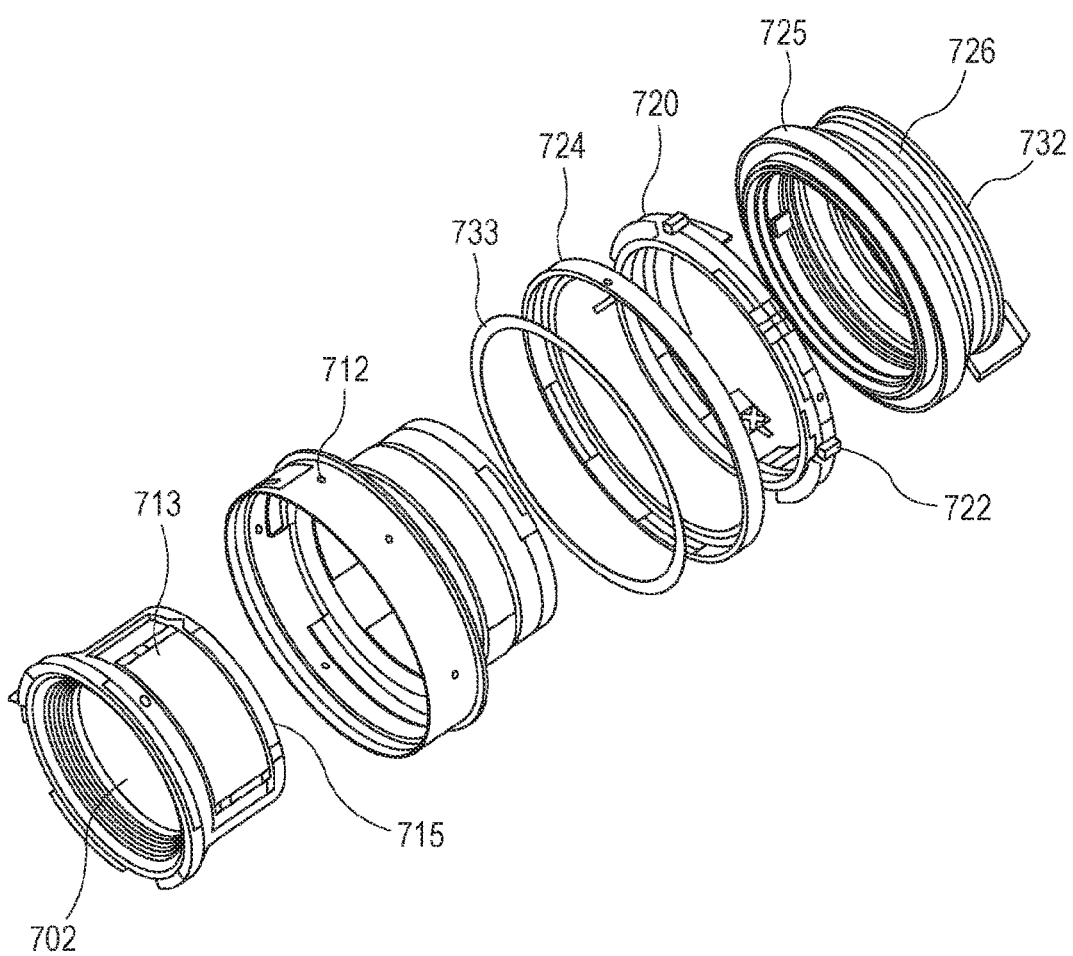
FIG. 8 is a schematic view of an optical apparatus according to an embodiment of the present invention.

FIGS. 7A and 7B show sectional views of the main portion of an interchangeable lens barrel of a single-lens reflex camera as an exemplary optical apparatus of the present invention. FIG. 8 shows an exploded perspective view of the interchangeable lens barrel of the single-lens reflex camera as an exemplary optical apparatus. A fixing barrel 712, a linear guide barrel 713 and a front group lens barrel 714 are fixed to a mount 711 at which the lens barrel is attached to or removed from the camera. These are fixing members for the interchangeable lens barrel.

The linear guide barrel 713 has a linear guide groove 713a for linearly guiding a focus lens 702 in an optical axis direction. Cam rollers 717a and 717b projecting radially outward are secured with an axis screw 718 to a rear group lens barrel 716 holding the focus lens 702. The cam roller 717a is fitted in the linear guide groove 713a.

A cam ring 715 is rotatably fitted on the inner periphery of the linear guide barrel 713. The relative movement of the linear guide barrel 713 and the cam ring 715 in the optical axis direction is restricted by fitting a roller 719 fixed to the cam ring 715 in a peripheral groove 713b of the linear guide barrel 713. The cam ring 715 is provided with a cam groove 715a therein for the focus lens 702. The cam roller 717b is also fitted in the cam groove 715a.

A rotation transmitting ring 720 is disposed at the outer periphery of the fixing barrel 712. The rotation transmitting ring 720 is held with a ball race 727 for rotation at a fixed position relative to the fixing barrel 712. The rotation transmitting ring 720 rotatably holds rollers 722 on axes 720f radially extending from the rotation transmitting ring 720. The portion 722a of each roller 722 having the larger diameter is in contact with the end 724b, in the direction of the mount, of a manual focusing ring 724 (hereinafter this end 724b is referred to as mount-side end). The portion 722b of the roller 722 having the smaller diameter is in contact with a binding member 729. Six rollers 722 are arranged at regular intervals on the outer periphery of the rotation transmitting ring 720, each in the same manner as described above.

A low friction sheet (washer member) 733 is disposed on the inner diameter portion of the manual focusing ring 724. The low friction sheet is pinched between the mount-side end 712a of the fixing barrel 712 and the front end 724a of the manual focusing ring 724. The outer diameter surface of the low friction sheet 733 is in a shape of ring and is fitted on the inner surface 724c defining the inner diameter of the manual focusing ring 724. Also, the inner surface 724c of the manual focusing ring 724 is fitted on the outer diameter portion 712b of the fixing barrel 712. The low friction sheet 733 serves to reduce the friction of the rotation ring mechanism for rotating the manual focusing ring 724 on the optical axis relative to the fixing barrel 712.

The larger diameter portion 722a of the roller 722 and the mount-side end 724b of the manual focusing ring 724 are in contact with each other with a pressure applied by the force of a wave washer 726 pressing an ultrasonic motor 725 in a forward direction of the lens. Similarly, the smaller diameter portion 722b of the roller 722 and the binding member 729 are in contact with each other with an appropriate pressure applied by the force of the wave washer 726 pressing the ultrasonic motor 725 in a forward direction of the lens. The movement of the wave washer 726 toward the mount is restricted by a washer 732 bayonet-coupled to the fixing barrel 712. The spring force (urging force) generated by the wave washer 726 is transmitted to the ultrasonic motor 725 and further to the roller 722, and presses the manual focusing ring 724 on the mount-side end 712a of the fixing barrel 712. Hence, the manual focusing ring 724 is incorporated in a state where it is pressed on the mount-side end 712a of the fixing barrel 712 with the low friction sheet 733 therebetween.

When the ultrasonic motor 725 is driven for rotation relative to the fixing barrel 712 by a controller (not shown), the roller 722 is rotated on the axis 720f because of the frictional contact between the binding member 729 and the smaller diameter portion 722b of the roller 722. The rotation of the roller 722 on the axis 720f causes the rotation transmitting ring 720 to rotate on the optical axis (autofocusing operation).

When a force is applied to the manual focusing ring 724 from the manual operation input portion (not shown) for rotation on the optical axis, the roller 722 is rotated on the axis 720f by friction because the mount-side end 724b of the manual focusing ring 724 is in pressure contact with the larger diameter portion 722a of the roller 722. The rotation of the larger diameter portion 722a of the roller 722 on the axis 720f causes the rotation transmitting ring 720 to rotate on the optical axis. At this time, the friction retaining force of the rotor 725c and the stator 725b prevents the ultrasonic motor 725 from rotating (manual focusing operation).

Two focus keys 728 are attached to the rotation transmitting ring 720 so as to oppose each other, and are fitted in a notch 715b formed in an end of a cam ring 715. Thus the rotation of the rotation transmitting ring 720 on the optical axis by autofocusing operation or manual focusing operation is transmitted to the cam ring 715 with the focus keys 728 therebetween. When the cam ring is rotated on the optical axis, the rear group lens barrel 716 whose rotation is restricted by the cam roller 717a and the linear guide groove 713a is reciprocally moved along the cam groove 715a in the cam ring 715 by the cam roller 717b. Thus, the focus lens 702 is driven for focusing.

Although the present embodiment has illustrated an interchangeable lens barrel of a single-lens reflex camera as an optical apparatus of an embodiment of the invention, the optical apparatus may be a compact camera, an electronic still camera, a camera in a mobile information terminal, or any other camera including an ultrasonic motor in the driving section.

Vibration Unit and Dust Removing Unit

Vibration units for delivering and removing particles, powder, or liquid are widely used in electronic apparatuses.

A dust removing unit including the piezoelectric element according to an embodiment of the present invention will now be described as an exemplary vibration unit. A vibration unit according to an embodiment of the present invention includes a vibration device including the above-described piezoelectric element or multilayer piezoelectric element and a diaphragm on which the piezoelectric element or the multilayer piezoelectric element is disposed. The dust removing unit of the present embodiment includes a vibration portion provided with the vibration unit, thus having the function of removing dust from the surface of the diaphragm.

Figure 9A:
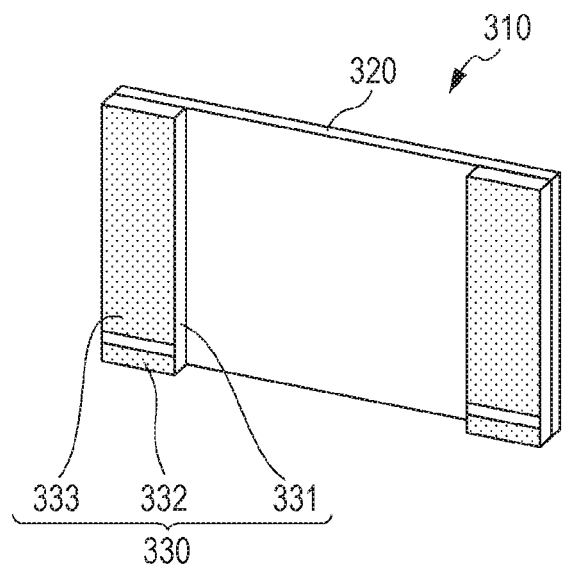
FIGS. 9A and 9B are schematic views of a vibration unit according to an embodiment of the present invention, used as a dust removing unit.
Figure 9B:
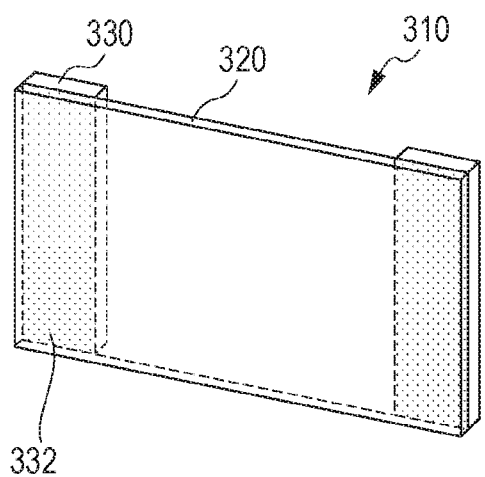

FIGS. 9A and 9B are schematic views of a dust removing unit according to an embodiment of the present invention. The dust removing unit 310 includes plate-like piezoelectric elements 330 and a diaphragm 320. The piezoelectric element 330 may be a multilayer piezoelectric element according to an embodiment of the present invention. The diaphragm 320 can be made of any material without particular limitation. For example, if the dust removing unit 310 is used in optical devices, an optically transparent material or an optically reflective material may be used for the diaphragm 320. Dust on the optically transparent portion or optically reflective portion of the diaphragm is removed.

Figure 10A:
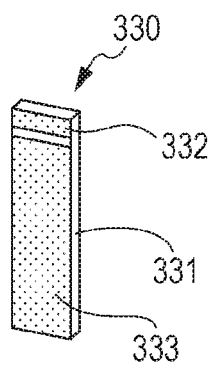
FIGS. 10A to 10C are schematic views of the structures of the piezoelectric element used in a dust removing unit.
Figure 10B:
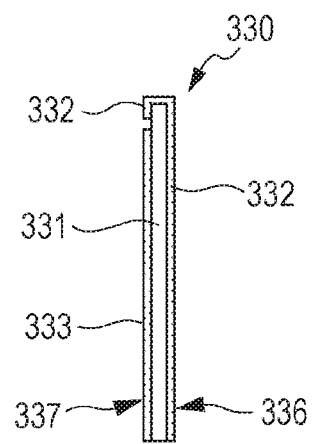
Figure 10C:
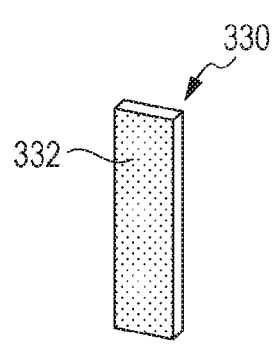

FIGS. 10A to 10C are schematic views of the piezoelectric element 330 shown in FIGS. 9A and 9B. FIGS. 10A and 10C show the front and the rear of the piezoelectric element 330, and FIG. 10B shows a side of the piezoelectric element 330. As shown in FIGS. 9A and 9B, the piezoelectric element 330 includes a piezoelectric material portion 331 made of a piezoelectric material, a first electrode 332 and a second electrode 333. The first electrode 332 and the second electrode 333 oppose each other with the piezoelectric material portion 331 therebetween. As mentioned with reference to FIGS. 9A and 9B, the piezoelectric element 330 may be a multilayer piezoelectric element according to an embodiment of the present invention. In this instance, the piezoelectric material portion 331 includes piezoelectric material layers and inner electrodes that are alternately stacked on each other, and the inner electrodes are electrically connected alternately to the first electrode 332 and the second electrode 333 so that the piezoelectric material layers provide driving waves having different phases. The surface of the piezoelectric element 330 provided with the first electrode 332 viewed in FIG. 10C is referred to as a first electrode surface 336. The surface of the piezoelectric element 330 provided with the second electrode 333 viewed in FIG. 10A is referred to as a second electrode surface 337.

The electrode surfaces each refer to the surface of the piezoelectric element provided with an electrode. For example, as shown in FIGS. 10A to 10C, the first electrode 332 may round and extend to the second electrode surface 337.

The piezoelectric elements 330 are fixed to the diaphragm 320 in such a manner that the first electrode surfaces 336 of the piezoelectric elements 330 are bonded to a surface of the diaphragm 320, as shown in FIGS. 9A and 9B. When the piezoelectric element 330 is operated, a stress occurs between the piezoelectric element 330 and the diaphragm 320, and the diaphragm 320 generates out-of-plane vibration. In the dust removing unit 310 of the present embodiment, dust on the surface of the diaphragm 320 is removed by the out-of-plane vibration of the diaphragm 320. The term out-of-plane vibration refers to an elastic vibration that displaces a diaphragm in the direction of the optical axis, that is, in the thickness direction of the diaphragm.

Figure 11A:
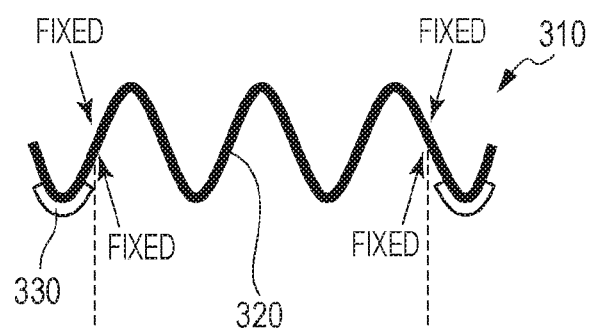
FIGS. 11A and 11B are schematic representations illustrating the principle of the vibration of a dust removing unit according to an embodiment of the present invention.
Figure 11B:
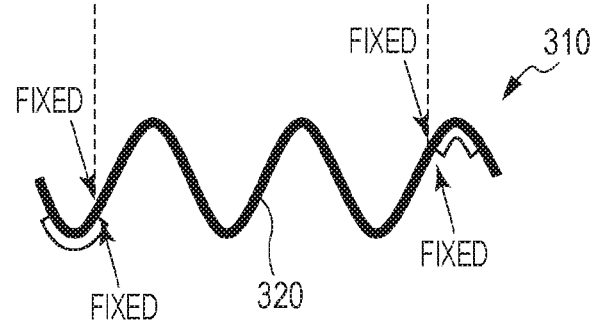

FIGS. 11A and 11B are schematic representations illustrating the principle of the vibration of the dust removing unit 310. FIG. 11A shows a state where out-of-plane vibration is generated in the diaphragm 320 by applying an in-phase alternating electric field to a pair of piezoelectric elements 330 opposing in a side-to-side direction. The piezoelectric material (piezoelectric material portion 331) of each piezoelectric element 330 is polarized in the same direction as the thickness direction of the piezoelectric element 330, and the dust removing unit 310 is operated in a seventh-order vibration mode. FIG. 11B shows a state where out-of-plane vibration is generated in the diaphragm 320 by applying a reverse phase alternating electric field with a phase difference of 180° to the pair of piezoelectric elements 330. In this instance, the dust removing unit 310 operates in a sixth-order vibration mode. By operating the dust removing unit 310 in at least two vibration modes depending on cases, dust on the surface of the diaphragm can be removed effectively.

Image Sensing Apparatus

Figure 12:
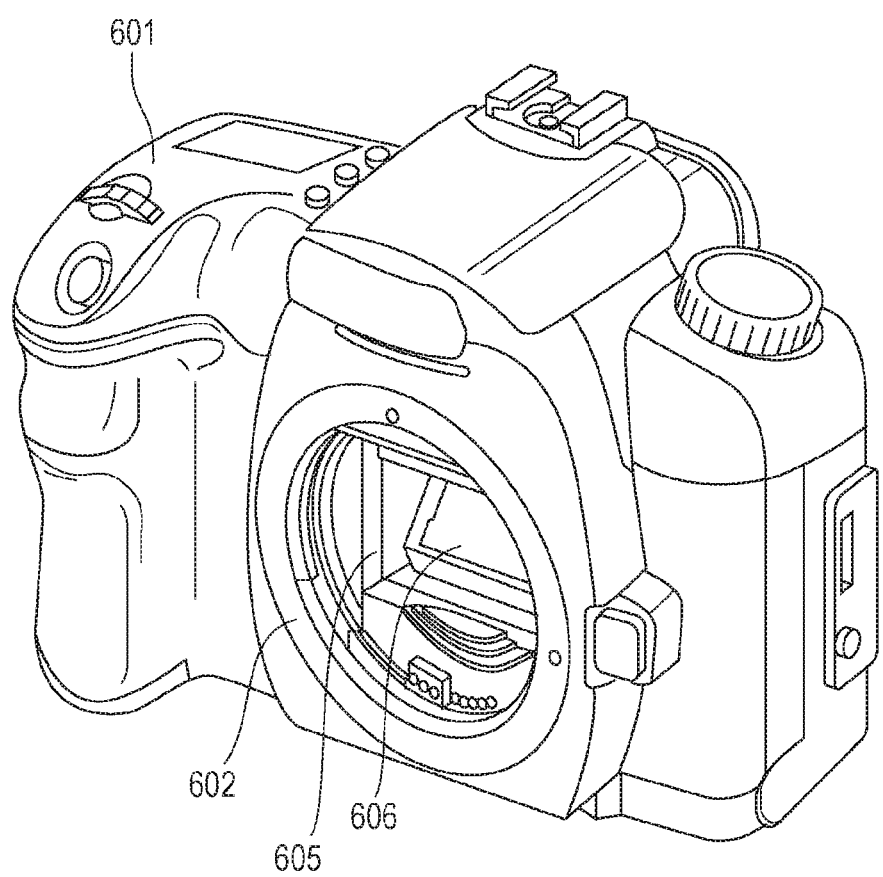
FIG. 12 is a schematic view of an image sensing apparatus according to an embodiment of the present invention.
Figure 13:
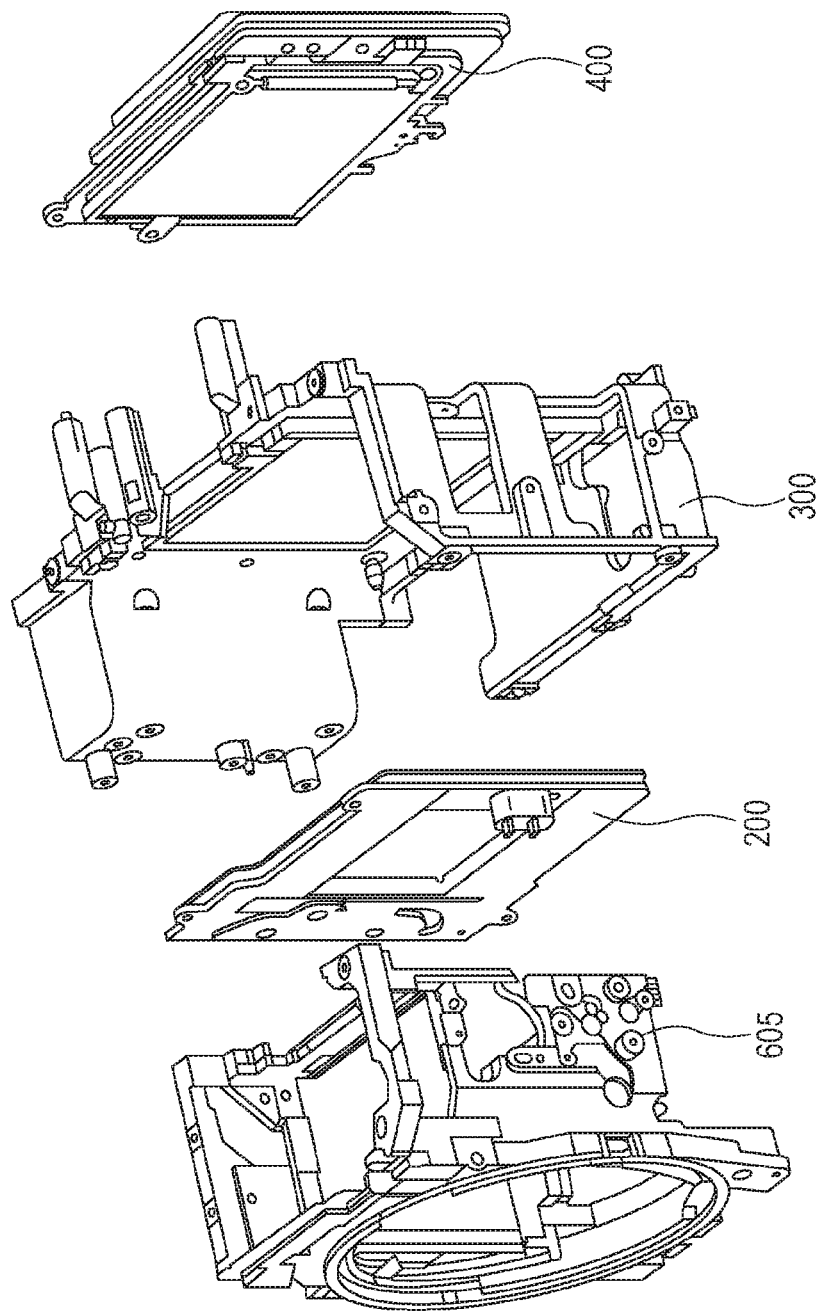
FIG. 13 is a schematic view of an image sensing apparatus according to an embodiment of the present invention.

An image sensing apparatus according to an embodiment will now be described. The image sensing apparatus includes an image sensing element unit having a light receiving face, and the above-described dust removing unit at the light receiving face of the image sensing element unit. FIGS. 12 and 13 show a digital single-lens reflex camera as an exemplary image sensing apparatus according to an embodiment of the present invention.

FIG. 12 is a front perspective view of the body 601 of the camera viewed from the object, showing a state where the photographing lens unit is removed. FIG. 13 is an exploded perspective view of the general structure of the camera, for illustrating the structure around the dust removing unit and an image sensing unit 400.

The body 601 shown in FIG. 12 is provided therein with a mirror box 605 to which a photographing light beam having passed through the photographing lens is guided. The mirror box 605 contains a main mirror (quick return mirror) 606. The main mirror 606 can take a position kept at an angle of 45° with respect to the photographing optical axis so as to conduct the photographing light beam to a penta roof mirror (not shown), and a position retracted from the photographing light beam so as to conduct the light beam to an image sensing element (not shown).

Referring to FIG. 13, the body 601 includes a chassis 300 acting as the frame of the body, and the chassis 300 is provided with mirror box 605 and a shutter unit 200 in that order from the direction of the object toward the chassis 300. The image sensing unit 400 includes a diaphragm of a dust removing unit and an image sensing element unit. The diaphragm is coaxially aligned with the light receiving face of the image sensing element unit. Also, an image sensing unit 400 is disposed at the photographer side of the chassis 300. The image sensing unit 400 is disposed on the mounting face of the mounting portion 602 (FIG. 12), with respect to which the photographing lens unit is mounted, and the image sensing unit is also adjusted so that the image sensing face of the image sensing element unit becomes parallel to the mounting face of the mounting portion with a predetermined distance therebetween.

The image sensing unit 400 includes a vibration member of a dust removing unit and an image sensing element unit. The vibration member of the dust removing unit is coaxially aligned with the light receiving face of the image sensing element unit.

Although a digital single-lens reflex camera has been described as the image sensing apparatus of an embodiment of the present invention, the image sensing apparatus may be a photographing lens-interchangeable camera such as a mirrorless digital single-lens reflex camera not including the mirror box 605. In an embodiment, the image sensing apparatus may be a photographing lens unit-interchangeable video cameras, a copy machine, a facsimile, a scanners or any other image sensing apparatus, or may be applied to an electronic apparatus including such an image sensing apparatus and required to remove dust from the surface of the optical component.

Electronic Apparatus

An electronic apparatus according to an embodiment will now be described. An electronic apparatus according to an embodiment of the present invention includes a piezoelectric acoustic component including the above-described piezoelectric element or multilayer piezoelectric element. Examples of the piezoelectric acoustic component include a loud-speaker, a beeper, a microphone, and a surface acoustic wave (SAW) element.

Figure 14:
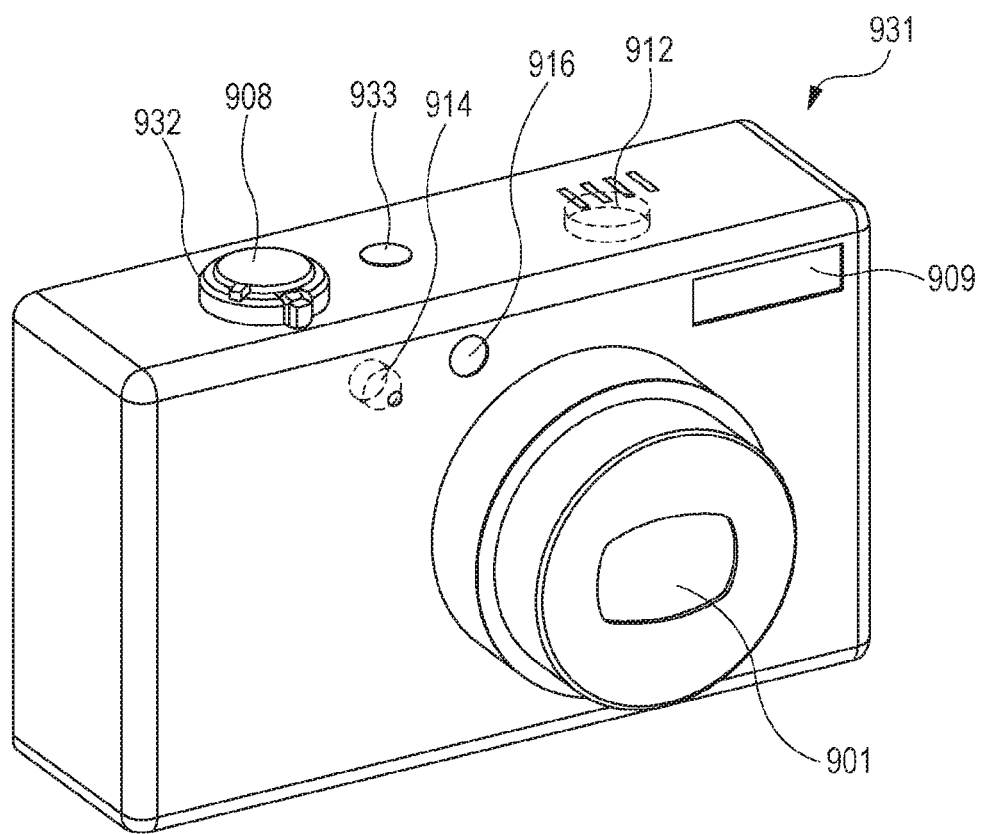
FIG. 14 is a schematic view of an electronic apparatus according to an embodiment of the present invention.

FIG. 14 shows a perspective view of a digital camera as an exemplary electronic apparatus, viewed from the front of the body 931. The body 931 is provided with an optical device 901, a microphone 914, an electronic flash emitting portion 909 and an auxiliary light portion 916 at the front face thereof. The microphone 914 is embedded in the body 931, being indicated by a dashed line. The microphone 914 has a hole in front thereof for picking up sounds from the outside.

The body 931 is also provided on the upper face thereof with a power button 933, a loudspeaker 912, a zoom lever 932, and a release button 908 for focusing operation. The loudspeaker 912 is embedded in the body 931, being indicated by a dashed line. A hole is formed in front of the loudspeaker 912 and through which sounds are transmitted to the outside.

The above-described piezoelectric acoustic component is used as at least one of the microphone 914, the loudspeaker 912 and the surface acoustic wave element.

Although a digital camera has been described as an exemplary embodiment of the electronic apparatus of the present invention, the electronic apparatus may be any electronic apparatus including the piezoelectric acoustic component, such as a sound reproduction apparatus, a sound recorder, a cellular phone, or an information terminal.

As described above, the piezoelectric element and the multilayer piezoelectric element of the present invention are suitable for liquid ejecting heads, liquid ejecting apparatuses, ultrasonic motors, optical apparatuses, vibration units, dust removing units, image sensing apparatuses, and electronic apparatuses. The piezoelectric element and the multilayer piezoelectric element can be particularly satisfactorily used at low temperatures.

The use of the piezoelectric element and the multilayer piezoelectric element of the present invention can provide a liquid ejecting head that has a nozzle density and ejection speed higher than or equal to those of liquid ejecting heads including a lead-containing piezoelectric element.

Also, the use of the liquid ejecting head of the present invention can provide a liquid ejecting apparatus that can exhibit an ejection speed and ejection accuracy higher than or equal to those of liquid ejecting apparatuses including a lead-containing piezoelectric element.

The use of the piezoelectric element and the multilayer piezoelectric element of the present invention can provide an ultrasonic motor that can exhibit a driving force and durability higher than or equal to those in the case of using a lead-containing piezoelectric element.

Also, the use of the ultrasonic motor of the present invention can provide an optical apparatus that can exhibit a durability and operation accuracy higher than or equal to those in the case of using a lead-containing piezoelectric element.

The use of the piezoelectric element and the multilayer piezoelectric element of the present invention can provide a vibration unit that can exhibit a vibration performance and durability higher than or equal to those in the case of using a lead-containing piezoelectric element.

The use of the vibration unit of the present invention provides a dust removing unit that can exhibit a dust-removing efficiency and durability higher than or equal to those in the case of using a lead-containing piezoelectric element.

The use of the dust removing unit of the present invention provides an image sensing apparatus that can exhibit a dust-removing ability higher than or equal to that in the case of using a lead-containing piezoelectric element.

Also, the use of a piezoelectric acoustic component including the piezoelectric element or multilayer piezoelectric element of the present invention can provide an electronic apparatus that can exhibit sound generation higher than or equal to that in the case of using a lead-containing piezoelectric element.

The piezoelectric material of the present invention can also be used in other devices, such as ultrasonic oscillators, piezoelectric actuators, piezoelectric sensors, and ferroelectric memory devices, in addition to the above-described apparatuses or units such as the liquid ejecting head and the ultrasonic motor.

EXAMPLES

The present invention will be further described with reference to the following Examples. However, the invention is not limited to the disclosed Examples.

Piezoelectric materials were prepared as below.
Piezoelectric Materials

Piezoelectric Material of Example 1

Raw materials for the composition $(Ba_{0.920}Ca_{0.080})_{1.0017}(Ti_{0.930}Zr_{0.070})O_3$, which is a composition of general formula (1) $(Ba_{1-x}Ca_x)_a(Ti_{1-y}Zr_y)O_3$ in which x=0.080, y=0.070 and a=1.0017, were weighed out as below.

Raw material powders of barium titanate having an average particle size of 100 nm and a purity of 99.99% or more, calcium titanate having an average particle size of 300 nm and a purity of 99.99% or more, and calcium zirconate having an average particle size of 300 nm and a purity of 99.99% or more were prepared by solid phase processes, and the raw material powders were weighed out so that the proportions of Ba, Ca, Ti and Zr satisfy the composition $(Ba_{0.920}Ca_{0.080})_{1.0017}(Ti_{0.930}Zr_{0.070})O_3$. In order to control the ratio a of the moles of Ba and Ca in the A site to the moles of Ti and Zr in the B site, barium carbonate and calcium carbonate were used.

Manganese dioxide was weighed so that the content of the first sub-constituent Mn would be 0.150 part by weight in terms of metal element relative to 100 parts by weight of the main constituent of the piezoelectric material, that is, the perovskite-type metal oxide expressed by $(Ba_{0.920}Ca_{0.080})_{1.0017}(Ti_{0.93}Zr_{0.070})O_3$. Bismuth oxide was weighed so that the content of the second sub-constituent Bi would be 0.278 part by weight in terms of metal element relative to 100 parts by weight of the main constituent metal oxide. silicon dioxide and boron oxide were weighed so that the content of a third sub-constituent Si would be 0.033 part by weight in terms of element and the content of another third sub-constituent B would be 0.017 part by weight in terms of element, each relative to 100 parts by weight of the main constituent metal oxide. Copper (II) oxide was weighed so that the content of the fourth sub-constituent Cu would be 0.479 part by weight in terms of metal element relative to 100 parts by weight of the main constituent metal oxide.

All the powders weighed out were mixed in a dry manner in a ball mill for 24 hours. A PVA binder in a proportion of 3 parts by weight to the total weight of the mixture of the powders was applied to the surfaces of the powder particles for granulation, using a spray dryer.

The granulated powder was compacted into a disk-shaped compact with a press forming machine at a pressure of 200 MPa. The resulting compact produced the same effect as the case where this compact was further compressed using a cold isostatic press machine.

The compact was sintered in an air atmosphere in an electric furnace over a period of 24 hours in total, including being held at temperatures up to a maximum temperature $T_{max}$ of 1200° C. for 4 hours. Thus a ceramic constituted of the piezoelectric material of an embodiment of the invention was produced.

The resulting ceramic was subjected to measurements for the average equivalent circular diameter of the crystal grains of the ceramic and the relative density of the ceramic. The average equivalent circular diameter was 4.46 μm, and the relative density was 95.2%. For the observation of the crystal grains, a polarizing microscope was mainly used. For determining the grain sizes of small crystal grains, a scanning electron microscope (SEM) was used. The photographic images taken through the polarizing microscope and the scanning electron microscope were processed for calculating the average equivalent circular diameter. For estimating the relative density, Archimedian method was used.

Subsequently, the ceramic was polished to a thickness of 0.5 mm and subjected to X-ray diffraction for analyzing the crystal structure. As a result, all the observed peaks derived from the perovskite structure.

The composition of the ceramic was estimated by ICP emission spectroscopy. It was thus found that the piezoelectric material mainly contained a metal oxide expressed by the chemical formula $(Ba_{0.920}Ca_{0.080})_{1.0017}(Ti_{0.930}Zr_{0.070})O_3$, and further contained 0.150 part by weight of Mn in terms of metal element, 0.278 part by weight of Bi in terms of metal element, 0.0001 part by weight of Mg in terms of metal element, 0.033 part by weight of Si in terms of element, 0.017 part by weight of B in terms of element and 0.479 part by weight of Cu in terms of metal element, each relative to 100 parts by weight of the main constituent metal oxide. The Mg derived probably from the raw materials. For the other constituent elements, the composition of the sintered ceramic corresponded to the proportions of the constituents weighed out.

The crystal grains of the ceramic were observed again. The average equivalent circular diameter after polishing was not much varied from that before polishing.

Piezoelectric Materials of Examples 2 to 26D

Piezoelectric materials of Examples 2 to 26 D were prepared in the same manner as in Example 1, except that lithium carbonate powder was used as needed in addition to the raw materials used in Example 1. First, raw material powders were weighed out so that the Ba, Ca, Ti and Zr contents satisfied the proportions shown in Table 1. In order to control the ratio a of the moles of Ba and Ca in the A site to the moles of Ti and Zr in the B site, barium carbonate and calcium carbonate were used. Then, manganese dioxide, bismuth oxide, lithium carbonate, silicon dioxide, boron oxide and copper (II) oxide were weighed so that the content of Mn as the first sub-constituent, the content of Bi and Li as the second sub-constituent, the content of Si and B as the third sub-constituent, and the content of Cu as the fourth sub-constituent, each in terms of element, would satisfy the proportions shown in Table 1 relative to 100 parts by weight of $(Ba_{1-x}Ca_x)_a(Ti_{1-y}Zr_y)O_3$ calculated using the total weight of the weighed raw material powders: barium titanate, calcium titanate, calcium zirconate, barium carbonate, and calcium carbonate.

All the powders weighed out were mixed in a dry manner in a ball mill for 24 hours. A PVA binder in a proportion of 3 parts by weight to the total weight of the mixture of the powders was applied to the surfaces of the powder particles for granulation, using a spray dryer.

In Examples 18 to 21, magnesium oxide was added to Mg contents of 0.0049 part by weight, 0.0099 part by weight, 0.0499 part by weight and 0.0999 part by weight, respectively, in terms of metal element, in addition to the Mg deriving from the raw materials. In Example 26B, a larger amount of magnesium oxide was added to an increased Mg content of 0.4999 part by weight in terms of metal element.

The granulated powder was compacted into a disk-shaped compact with a press forming machine at a pressure of 200 MPa.

The compact was sintered in an air atmosphere in an electric furnace over a period of 24 hours in total, including being held at temperatures up to a maximum temperature $T_{max}$ shown in Table 1 for 4 hours. Thus ceramics constituted of the piezoelectric material of an embodiment of the invention were produced.

The average equivalent circular diameter and the relative density were estimated in the same manner as in Example 1. The results are shown in Table 2. The compositions of the ceramics were estimated in the same manner as in Example 1. For all the piezoelectric materials, the composition of the sintered ceramic corresponded to the proportions of the constituents Ba, Ca, Ti, Zr, Mn, Bi, Li, Si, B and Cu weighed out.

The piezoelectric materials of Examples 2 to 17 and 22 to 26A, 26C, and 26D contained 0.001 part by weight of Mg relative to 100 parts by weight of $(Ba_{1-x}Ca_x)_a(Ti_{1-y}Zr_y)O_3$ obtained by calculation. The Mg derived probably from the raw materials.

In Examples 18 to 21, the piezoelectric materials contained Mg with contents of 0.0050 part by weight, 0.0100 part by weight, 0.0500 part by weight, and 0.1000 part by weight, respectively. In Example 26B, the piezoelectric material contained 0.5000 part by weight of Mg.

TABLE 1

| | Main constituent | | | | | First sub-constituent | Second sub-constituent | | Third sub-constituent | | | Fourth sub-constituent | Maximum temperature |
|---|---|---|---|---|---|---|---|---|---|---|---|---|---|
| | | | | | | Mn | Bi | Li | S | B | Total | Cu | |
| | Ba 1-x | Ca x | Ti 1-y | Zr y | A/B a | Part(s) by weight | Part(s) by weight | Part(s) by weight | Part(s) by weight | Part(s) by weight | Part(s) by weight | Part(s) by weight | Tmax [° C.] |
| Example 1 | 0.920 | 0.080 | 0.930 | 0.070 | 1.0017 | 0.150 | 0.278 | 0.000 | 0.033 | 0.017 | 0.050 | 0.479 | 1200 |
| Example 2 | 0.920 | 0.080 | 0.930 | 0.070 | 1.0200 | 0.150 | 0.278 | 0.000 | 0.033 | 0.017 | 0.050 | 0.479 | 1200 |
| Example 3 | 0.920 | 0.080 | 0.930 | 0.070 | 0.9860 | 0.150 | 0.278 | 0.000 | 0.033 | 0.017 | 0.050 | 0.479 | 1200 |
| Example 4 | 0.920 | 0.080 | 0.950 | 0.050 | 0.9972 | 0.040 | 0.278 | 0.000 | 0.033 | 0.017 | 0.050 | 0.479 | 1200 |
| Example 5 | 0.920 | 0.080 | 0.950 | 0.050 | 1.0055 | 0.240 | 0.278 | 0.000 | 0.033 | 0.017 | 0.050 | 0.479 | 1200 |
| Example 6 | 0.920 | 0.080 | 0.950 | 0.050 | 1.0163 | 0.500 | 0.278 | 0.000 | 0.033 | 0.017 | 0.050 | 0.479 | 1200 |
| Example 7 | 0.920 | 0.080 | 0.970 | 0.030 | 1.0100 | 0.300 | 0.042 | 0.000 | 0.033 | 0.017 | 0.050 | 0.479 | 1200 |
| Example 8 | 0.930 | 0.070 | 0.970 | 0.030 | 1.0007 | 0.100 | 0.850 | 0.000 | 0.033 | 0.017 | 0.050 | 0.479 | 1200 |
| Example 9 | 0.970 | 0.030 | 0.920 | 0.080 | 1.0072 | 0.150 | 0.278 | 0.000 | 0.033 | 0.017 | 0.050 | 0.479 | 1200 |
| Example 10 | 0.970 | 0.030 | 0.970 | 0.030 | 1.0072 | 0.150 | 0.278 | 0.000 | 0.033 | 0.017 | 0.050 | 0.479 | 1200 |
| Example 11 | 0.912 | 0.088 | 0.970 | 0.030 | 1.0057 | 0.150 | 0.278 | 0.000 | 0.033 | 0.017 | 0.050 | 0.479 | 1200 |
| Example 12 | 0.912 | 0.088 | 0.920 | 0.080 | 1.0062 | 0.150 | 0.278 | 0.000 | 0.033 | 0.017 | 0.050 | 0.479 | 1200 |
| Example 13 | 0.960 | 0.040 | 0.920 | 0.080 | 1.0017 | 0.150 | 0.278 | 0.000 | 0.033 | 0.017 | 0.050 | 0.479 | 1200 |
| Example 14 | 0.960 | 0.040 | 0.960 | 0.040 | 1.0017 | 0.150 | 0.278 | 0.000 | 0.033 | 0.017 | 0.050 | 0.479 | 1200 |
| Example 15 | 0.912 | 0.088 | 0.960 | 0.040 | 1.0017 | 0.150 | 0.278 | 0.000 | 0.033 | 0.017 | 0.050 | 0.479 | 1200 |
| Example 16 | 0.920 | 0.080 | 0.930 | 0.070 | 1.0017 | 0.150 | 0.278 | 0.014 | 0.033 | 0.017 | 0.050 | 0.479 | 1200 |
| Example 17 | 0.912 | 0.088 | 0.970 | 0.030 | 1.0017 | 0.150 | 0.278 | 0.028 | 0.033 | 0.017 | 0.050 | 0.479 | 1250 |
| Example 18 | 0.970 | 0.030 | 0.970 | 0.030 | 1.0017 | 0.150 | 0.278 | 0.014 | 0.033 | 0.017 | 0.050 | 0.479 | 1250 |
| Example 19 | 0.920 | 0.080 | 0.930 | 0.070 | 1.0017 | 0.150 | 0.278 | 0.000 | 4.000 | 0.000 | 4.000 | 0.479 | 1200 |
| Example 20 | 0.920 | 0.080 | 0.930 | 0.070 | 1.0017 | 0.150 | 0.278 | 0.000 | 0.000 | 4.000 | 4.000 | 0.479 | 1200 |
| Example 21 | 0.920 | 0.080 | 0.930 | 0.070 | 1.0017 | 0.150 | 0.278 | 0.000 | 2.000 | 2.000 | 4.000 | 0.479 | 1200 |
| Example 22 | 0.920 | 0.080 | 0.930 | 0.070 | 1.0017 | 0.150 | 0.278 | 0.000 | 0.033 | 0.017 | 0.050 | 0.010 | 1200 |
| Example 23 | 0.920 | 0.080 | 0.930 | 0.070 | 1.0017 | 0.150 | 0.278 | 0.000 | 0.033 | 0.017 | 0.050 | 0.080 | 1200 |
| Example 24 | 0.920 | 0.080 | 0.930 | 0.070 | 1.0017 | 0.150 | 0.278 | 0.000 | 0.033 | 0.017 | 0.050 | 3.000 | 1200 |
| Example 25 | 0.920 | 0.080 | 0.930 | 0.070 | 1.0017 | 0.150 | 0.278 | 0.000 | 0.033 | 0.017 | 0.050 | 4.000 | 1200 |
| Example 26A | 0.920 | 0.080 | 0.930 | 0.070 | 1.0017 | 0.150 | 0.278 | 0.000 | 0.033 | 0.017 | 0.050 | 0.479 | 1400 |
| Example 26B | 0.920 | 0.080 | 0.950 | 0.050 | 1.0057 | 0.150 | 0.278 | 0.000 | 0.033 | 0.017 | 0.050 | 0.479 | 1200 |
| Example 26C | 0.940 | 0.060 | 0.950 | 0.050 | 0.9970 | 0.180 | 0.278 | 0.000 | 0.033 | 0.017 | 0.050 | 0.080 | 1200 |
| Example 26D | 0.920 | 0080 | 0.950 | 0.050 | 0.9968 | 0.180 | 0.278 | 0.000 | 0.033 | 0.017 | 0.050 | 0.080 | 1200 |
| Comparative Example 1 | 1.000 | 0.000 | 0.950 | 0.050 | 1.0037 | 0.150 | 0.082 | 0.000 | 0.033 | 0.017 | 0.050 | 0.479 | 1200 |
| Comparative Example 2 | 0.700 | 0.300 | 0.950 | 0.050 | 1.0037 | 0.150 | 0.278 | 0.000 | 0.033 | 0.017 | 0.050 | 0.479 | 1250 |
| Comparative Example 3 | 0.920 | 0.080 | 1.000 | 0.000 | 1.0027 | 0.150 | 0.278 | 0.000 | 0.033 | 0.017 | 0.050 | 0.479 | 1220 |
| Comparative Example 4 | 0.920 | 0.080 | 0.800 | 0.200 | 1.0027 | 0.150 | 0.278 | 0.000 | 0.033 | 0.017 | 0.050 | 0.479 | 1220 |
| Comparative Example 5 | 0.920 | 0.080 | 0.950 | 0.050 | 0.9635 | 0.150 | 0.278 | 0.000 | 0.033 | 0.017 | 0.050 | 0.479 | 1250 |
| Comparative Example 6 | 0.920 | 0.080 | 0.950 | 0.050 | 1.0460 | 0.150 | 0.278 | 0.000 | 0.033 | 0.017 | 0.050 | 0.479 | 1250 |
| Comparative Example 7 | 0.920 | 0.080 | 0.950 | 0.050 | 0.9985 | 0.000 | 0.278 | 0.000 | 0.033 | 0.017 | 0.050 | 0.479 | 1200 |
| Comparative Example 8 | 0.920 | 0.080 | 0.950 | 0.050 | 1.0401 | 1.000 | 0.278 | 0.000 | 0.033 | 0.017 | 0.050 | 0.479 | 1200 |
| Comparative Example 9 | 0.920 | 0.080 | 0.970 | 0.030 | 1.1232 | 0.300 | 0.015 | 0.000 | 0.033 | 0.017 | 0.050 | 0.479 | 1200 |
| Comparative Example 10 | 0.920 | 0.080 | 0.950 | 0.050 | 1.0017 | 0.150 | 1.700 | 0.000 | 0.033 | 0.017 | 0.050 | 0.479 | 1250 |
| Comparative Example 11 | 0.920 | 0.080 | 0.950 | 0.050 | 1.0057 | 0.150 | 0.278 | 0.030 | 0.033 | 0.017 | 0.050 | 0.479 | 1250 |
| Comparative Example 12 | 0.920 | 0.080 | 0.930 | 0.070 | 1.0017 | 0.150 | 0.278 | 0.000 | 4.000 | 3.000 | 7.000 | 0.479 | 1200 |
| Comparative Example 13 | 0.900 | 0.100 | 1.000 | 0.000 | 1.0055 | 0.144 | 0.000 | 0.000 | 0.000 | 0.000 | 0.000 | 0.000 | 1300 |
| Comparative Example 14 | 0.850 | 0.150 | 0.900 | 0.100 | 1.0017 | 0.000 | 0.000 | 0.000 | 0.000 | 0.000 | 0.000 | 0.000 | 1300 |
| Comparative Example 15 | 0.700 | 0.300 | 0.950 | 0.050 | 1.0017 | 0.150 | 0.278 | 0.000 | 0.033 | 0.017 | 0.050 | 0.000 | 1300 |
| Comparative Example 16 | 0.700 | 0.300 | 0.950 | 0.050 | 1.0017 | 0.150 | 0.278 | 0.000 | 0.033 | 0.017 | 0.050 | 7.000 | 1200 |

TABLE 2

| | Average equivalent circular diameter [μm] | Relative density [%] |
|---|---|---|
| Example 1 | 4.46 | 95.2 |
| Example 2 | 1.07 | 95.4 |
| Example 3 | 4.49 | 93.8 |
| Example 4 | 3.16 | 96.1 |
| Example 5 | 4.23 | 95.7 |
| Example 6 | 4.17 | 95.4 |
| Example 7 | 7.36 | 97.4 |
| Example 8 | 8.01 | 97.3 |
| Example 9 | 7.54 | 97.3 |
| Example 10 | 6.06 | 98.2 |
| Example 11 | 0.97 | 95.7 |
| Example 12 | 0.97 | 96.4 |
| Example 13 | 6.57 | 98.3 |
| Example 14 | 6.55 | 98.7 |
| Example 15 | 6.10 | 98.1 |
| Example 16 | 1.00 | 95.1 |
| Example 17 | 5.43 | 96.6 |
| Example 18 | 5.24 | 97.7 |
| Example 19 | 0.95 | 94.2 |
| Example 20 | 0.87 | 97.2 |
| Example 21 | 0.83 | 97.3 |
| Example 22 | 1.02 | 96.3 |
| Example 23 | 2.38 | 97.2 |
| Example 24 | 3.58 | 98.2 |
| Example 25 | 4.02 | 94.6 |
| Example 26A | 18.8 | 92.4 |
| Example 26B | 3.38 | 92.1 |
| Example 26C | 3.98 | 97.3 |
| Example 26D | 4.11 | 97.4 |
| Comparative Example 1 | 1.17 | 94.8 |
| Comparative Example 2 | 1.57 | 93.4 |
| Comparative Example 3 | 1.23 | 93.5 |
| Comparative Example 4 | 1.19 | 94.8 |
| Comparative Example 5 | 43.1 | 95.8 |
| Comparative Example 6 | 0.38 | 84.6 |
| Comparative Example 7 | 0.83 | 94.8 |
| Comparative Example 8 | 6.52 | 93.1 |
| Comparative Example 9 | 0.91 | 94.2 |
| Comparative Example 10 | 4.67 | 92.4 |
| Comparative Example 11 | 2.95 | 91.7 |
| Comparative Example 12 | 0.27 | 89.6 |
| Comparative Example 13 | 5.26 | 92.5 |
| Comparative Example 14 | 3.21 | 91.7 |
| Comparative Example 15 | 1.34 | 94.8 |
| Comparative Example 16 | 13.0 | 92.1 |

Metal Oxide Materials of Comparative Examples 1 to 16

Metal oxide materials of Comparative Examples were prepared in the same manner as in Example 1, according to the main constituent and the first to fourth sub-constituents, the mole ratio a of the moles in the A site to the moles in the B site, and the maximum temperature $T_{max}$ for sintering.

The average equivalent circular diameter and the relative density were estimated in the same manner as in Example 1. The results are shown in Table 2. The compositions of the ceramics were estimated in the same manner as in Example 1. For all the metal oxide materials, the composition of the sintered ceramic corresponded to the proportions of the constituents Ba, Ca, Ti, Zr, Mn, Bi, Li, Si and B weighed out. The metal oxide materials of Comparative Examples 1 to 16 contained 0.001 part by weight of Mg relative to 100 parts by weight of $(Ba_{1-x}Ca_x)_a(Ti_{1-y}Zr_y)O_3$ obtained by calculation. The Mg derived probably from the raw materials.

Preparation of Piezoelectric Element

Piezoelectric elements were prepared as below.

Piezoelectric Elements of Examples 1 to 26D

Piezoelectric elements were prepared using the piezoelectric materials of Examples 1 to 26D.

Gold electrodes having a thickness of 400 nm were formed on both sides of the disk-shaped ceramic by DC sputtering. In this instance, 30 nm thick adhesion layers were formed of titanium between the electrodes and the ceramic. The resulting ceramic with the electrodes was cut into a strip-shaped piezoelectric element measuring 10 mm×2.5 mm×0.5 mm.

The resulting piezoelectric element was polarized on a hot plate with the surface set to a temperature of 60° C. to 150° C. by applying an electric field of 14 kV/cm for 30 minutes.

Piezoelectric Elements of Comparative Examples 1 to 16

Next, comparative elements were prepared using the metal oxide materials of Comparative Examples 1 to 16 in the same manner as in Examples 1 to 26D, followed by polarization.

Properties of Piezoelectric Elements

The polarized piezoelectric elements prepared using the piezoelectric materials of Examples 1 to 26D and the comparative elements prepared using the metal oxide materials of Comparative Examples 1 to 16 were subjected to measurement for piezoelectric constant $d_{31}$ and mechanical quality factor Qm in the range of device operating temperatures (−30° C. to 50° C.). At the same time, the dielectric loss tangent was measured at some of the measurement temperatures with a commercially available impedance analyzer by applying an alternating voltage with a frequency of 1 kHz and an electric field intensity of 10 V/cm. The results are shown in Table 3. The sign × in the Table means that the resistivity of the element of the comparative example was so low that sufficient polarization was not applied, and therefore that the measurement result was not meaningful.

The environmental temperature was increased from 30° C. to 50° C. in increments of 5° C., then reduced to −30° C. in increments of 5° C., and further increased to 30° C. in increments of 5° C. in a thermostatic oven. Before estimation at each measuring temperature, the temperature was held for 10 minutes so that the thermostatic oven had a constant temperature. For measuring the piezoelectric constant $d_{31}$ and the mechanical quality factor Qm, a resonance-anti-resonance method was applied. Table 3 shows the lowest mechanical quality factor Qm and the lowest absolute value $|d_{31}|$ of the piezoelectric constant $d_{31}$ in the range of temperatures of −30° C. to 50° C. When the piezoelectric constant is low, the piezoelectric element requires a large electric field for driving a device, and hence the element is not suitable to drive devices. The piezoelectric constant $|d_{31}|$ is preferably 50 μm/V or more, and, more preferably 60 pm/V or more.

For estimating insulation performance, resistivity was measured. The resistivities of unpolarized piezoelectric elements were measured at room temperature (25° C.). The resistivity was estimated from the leakage current measured 20 seconds after applying a direct voltage of 10 V between the two electrodes. The results are shown in Table 3. When the resistivity is $1×10^9$ Ωcm or more, preferably $50×10^9$ Ωcm or more, the piezoelectric material and the piezoelectric element exhibit insulation performance sufficient in practice. The unit GΩcm of resistivity in Table 3 represents $10^9$ Ωcm.

TABLE 3

| | Qm at −30° C. | Lowest Qm in the range of −30° C. to 50° C. | Lowest $|d_{31}|$ (pm/V) in the range of −30° C. to 50° C. | Resistivity (GΩ · cm) at 25° C. | Largest dielectric loss tangent in the range of −30° C. to 50° C. |
|---|---|---|---|---|---|
| Example 1 | 563 | 561 | 97 | 247 | 0.0039 |
| Example 2 | 547 | 547 | 93 | 250 | 0.0039 |
| Example 3 | 551 | 549 | 91 | 256 | 0.0038 |
| Example 4 | 840 | 840 | 72 | 323 | 0.0035 |
| Example 5 | 800 | 800 | 65 | 161 | 0.0035 |
| Example 6 | 506 | 503 | 66 | 286 | 0.0038 |
| Example 7 | 500 | 500 | 61 | 16.0 | 0.0049 |
| Example 8 | 871 | 865 | 57 | 17.2 | 0.0049 |
| Example 9 | 700 | 700 | 66 | 20.0 | 0.0027 |
| Example 10 | 524 | 518 | 110 | 18.0 | 0.0026 |
| Example 11 | 481 | 481 | 102 | 224 | 0.0045 |
| Example 12 | 776 | 770 | 51 | 234 | 0.0043 |
| Example 13 | 976 | 971 | 127 | 324 | 0.0017 |
| Example 14 | 911 | 900 | 135 | 309 | 0.0040 |
| Example 15 | 896 | 890 | 134 | 298 | 0.0027 |
| Example 16 | 572 | 572 | 92 | 235 | 0.0050 |
| Example 17 | 498 | 496 | 102 | 204 | 0.0042 |
| Example 18 | 527 | 527 | 111 | 18.0 | 0.0026 |
| Example 19 | 489 | 485 | 56 | 29.0 | 0.0036 |
| Example 20 | 455 | 455 | 53 | 25.0 | 0.0034 |
| Example 21 | 461 | 461 | 53 | 29.0 | 0.0035 |
| Example 22 | 520 | 500 | 90 | 38.0 | 0.0054 |
| Example 23 | 558 | 518 | 96 | 231 | 0.0039 |
| Example 24 | 561 | 561 | 97 | 244 | 0.0039 |
| Example 25 | 554 | 524 | 99 | 34.0 | 0.0052 |
| Example 26A | 389 | 389 | 48 | 36.5 | 0.0054 |
| Example 26B | 373 | 360 | 38 | 3 | 0.0072 |
| Example 26C | 856 | 856 | 83 | 312 | 0.0033 |
| Example 26D | 869 | 869 | 81 | 305 | 0.0035 |
| Comparative Example 1 | 151 | 144 | 71 | 5 | 0.0072 |
| Comparative Example 2 | 261 | 261 | 32 | 7 | 0.0059 |
| Comparative Example 3 | 337 | 331 | 22 | 6 | 0.0057 |
| Comparative Example 4 | 190 | 190 | 67 | 4 | 0.0071 |
| Comparative Example 5 | 555 | 555 | 71 | 11.0 | 0.0044 |
| Comparative Example 6 | x | x | x | 0 | x |
| Comparative Example 7 | 225 | 215 | 85 | 1 | 0.0053 |
| Comparative Example 8 | 413 | 392 | 33 | 1 | 0.0101 |
| Comparative Example 9 | 111 | 100 | 67 | 8 | 0.0072 |
| Comparative Example 10 | 361 | 361 | 31 | 14.0 | 0.0060 |
| Comparative Example 11 | 311 | 310 | 34 | 8 | 0.0066 |
| Comparative Example 12 | 216 | 216 | 27 | 0 | 0.0830 |
| Comparative Example 13 | 113 | 113 | 34 | 1.02 | 0.0061 |
| Comparative Example 14 | 68 | 68 | 87 | 1.37 | 0.0079 |
| Comparative Example 15 | 227 | 210 | 26 | 1.04 | 0.0073 |
| Comparative Example 16 | 216 | 210 | 30 | 1.26 | 0.0081 |

High-Temperature Durability of Piezoelectric Element

Next, the piezoelectric elements of Examples 1, 4, 8 and 9 and the comparative elements of Comparative Examples 4 and 14 were subjected to high-temperature durability test at 85° C. for 24 hours in a thermostatic oven. Piezoelectric constants $d_{31}$ in the range of temperatures of −30° C. to 50° C. were measured before and after the high-temperature durability test, and the lowest absolute values $|d_{31}|$ were obtained. Table 4 shows the rate of change in lowest $|d_{31}|$ before and after the high-temperature durability test.

Curie Temperature of Piezoelectric Element

Figure 15:
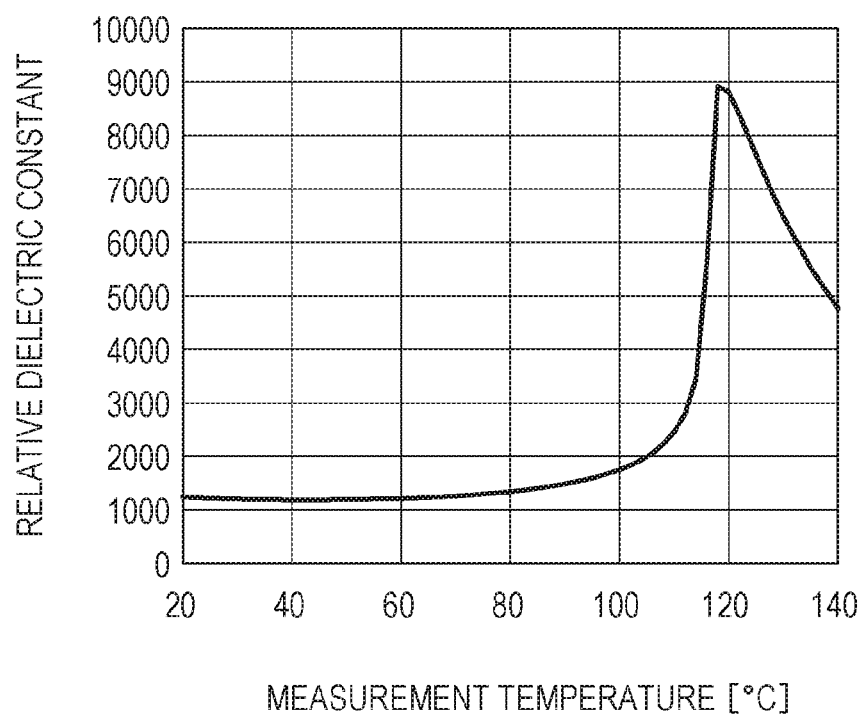
FIG. 15 is a plot showing the temperature dependence of the relative dielectric constant of the piezoelectric element of Example 8.

Next, the Curie temperatures Tc of the piezoelectric elements of Examples 1, 4, 8 and 9 and the comparative elements of Comparative Examples 4 and 14 were measured. Relative dielectric constant was measured with an impedance analyzer by applying a very low alternating electric field with varying temperatures. Thus the Tc was determined from the temperature at which the relative dielectric constant came to the maximum. The environmental temperature was increased to 20° C. to 80° C. in increments of 5° C., and further increased to 140° C. in increments of 2° C. in a thermostatic oven. Before estimation at each measuring temperature, the temperature was held for 10 minutes or more so that the thermostatic oven had a constant temperature. The results are shown in Table 4. In addition, FIG. 15 shows the changes of the relative dielectric constant depending on environmental temperature of the piezoelectric element of Example 8 by way of example.

TABLE 4

| | y | Curie temperatures Tc (° C.) | Lowest $|d_{31}|$ (pm/V) before high-temperature durability test | Lowest $|d_{31}|$ (pm/V) after high-temperature durability test | Rate of change (%) |
|---|---|---|---|---|---|
| Example 1 | 0.070 | 108 | 97 | 94 | −3.1 |
| Example 4 | 0.050 | 112 | 72 | 69 | −3.8 |
| Example 8 | 0.030 | 118 | 57 | 55 | −2.9 |
| Example 9 | 0.080 | 106 | 66 | 64 | −2.6 |
| Comparative Example 4 | 0.200 | 86 | 67 | 13 | −81.0 |
| Comparative Example 14 | 0.100 | 88 | 87 | 32 | −63.1 |

The results shown in Tables 3 and 4 will now be described.

In Comparative Example 1, in which the x value corresponding to the Ca content was lower than 0.030, the mechanical quality factor Qm decreases as the temperature is reduced, and the lowest Qm in the range of device operating temperatures was as low as less than 400, being lower than those in Examples 1 to 25.

In Comparative Examples 2 and 13, in which the x values were higher than 0.090, the lowest absolute value $|d_{31}|$ of the dielectric constant in the range of device operating temperatures was as low as less than 40 pm/V, being lower than those in Examples 1 to 25.

In Comparative Example 3, in which the y value corresponding to the Zr content was lower than 0.030, the lowest absolute value $|d_{31}|$ of the dielectric constant in the range of device operating temperatures was as low as less than 30 pm/V, being lower than those in Examples 1 to 25.

In Comparative Examples 4 and 14, in which the y value corresponding to the Zr content were higher than 0.080, the rate of change in absolute vale $|d_{31}|$ of the dielectric constant before and after high-temperature durability test significantly exceeded 10% in comparison with Examples 1, 4, 8 and 9, showing insufficient high-temperature durability. This is probably because when the y value is higher than 0.080, the Curie temperature decreases. Examples 1, 4, 8 and 9, in which the y value was less than 0.080, exhibited small changes of less than 5% in $|d_{31}|$ before and after high-temperature durability test, thus showing good high-temperature durability.

Examples 1 to 25 and 26A to 26D, which had x values of 0.030 or more and less than 0.090 and y values of 0.030 or more and less than 0.080, exhibited lowest Qm of 350 or more and lowest $|d_{31}|$ of 35 pm/V or more in the range of device operating temperatures. Among these, Examples 1 to 25 and 26C and 26D exhibited lowest Qm of 400 or more and lowest $|d_{31}|$ of 50 pm/V or more in the range of device operating temperatures, showing good mechanical quality factors and dielectric constants. In particular, Examples 26C and 26D exhibited lowest Qm of more than 800 and lowest $|d_{31}|$ of more than 80 in the range of device operating temperatures, showing superior characteristics.

Comparative Example 5, in which the a value was lower than 0.9860, exhibited an average equivalent circular diameter of 43.1 μm larger than those of Examples 1 to 25, showing the occurrence of abnormal grain growth. The mechanical strengths of the piezoelectric elements were estimated by three-point bending test with a tensile/completion tester (Tensilon RTC-1250A manufactured by Orientec). The element of comparative Example 5 exhibited a mechanical strength of 14 MPa, which was much lower than mechanical strengths of 40 MPa or more the piezoelectric elements of Examples 1 to 25 had.

Comparative Example 6, in which the a value was larger than 1.0200, exhibited excessively suppressed grain growth and accordingly a lower relative density in comparison with Examples 1 to 25. Consequently, the resistivity of the element of Comparative Example 6 was so low that polarization was not applied.

In Comparative Example 7, in which the Mn content was lower than 0.040 part by weight, the lowest Qm was as low as less than 300, being lower than those in Examples 1 to 25. Accordingly, when the element was used in an resonance device, the power consumption of the resonance device was increased.

Comparative Example 8, in which the Mn content was higher than 0.500 part by weight, exhibited a dielectric loss tangent of larger than 0.005 that was larger than those in Examples 1 to 25.

Example 26B, in which the Mg content was higher than 0.10 part by weight, exhibited good properties sufficient in practice, but had a dielectric loss tangent of larger than 0.005 and a lowest $|d_{31}|$ of lower than 50 pm/V, relative to those in Examples 1 to 25.

In Comparative Example 9, in which the Bi content was lower than 0.042 part by weight, the lowest Qm in the range of device operating temperatures decreased significantly to less than 400, in comparison with Examples 1 to 25. Accordingly, when an resonance device including the comparative element was operated at −30° C., the power consumption of the resonance device was increased.

Comparative Example 10, in which the Bi content was higher than 0.850 part by weight, exhibited a lowest $|d_{31}|$ of less than 50 pm/V that was lower than in Examples 1 to 25.

Comparative Example 11, in which the Li content was higher than 0.028 part by weight, exhibited a lowest $|d_{31}|$ of less than 50 pm/V that was lower than in Examples 1 to 25.

The composition of Example 1 was a piezoelectric material in which the content of the third sub-constituent including at least one of Si and B, that is, total content of Si and B, was 0.050 part by weight. It was however confirmed that even if the third sub-constituent content is as low as about $1/100$ of 0.050 part by weight, the resistivity can be increased.

Example 26B, in which the Mg content was higher than 0.10 part by weight, exhibited a lowest Qm of less than 400 that was lower than in Examples 1 to 25, in the range of device operating temperatures.

Comparative Example 12, in which the total content of Si and B was higher than 4.000 parts by weight, exhibited a dielectric loss tangent of higher than 0.005 and a lowest $|d_{31}|$ of less than 50 pm/V, in comparison with Examples 1 to 25.

Example 22 was a piezoelectric material in which the content of the fourth sub-constituent Cu was 0.010 part by weight. It was however confirmed that even if the fourth sub-constituent content is as low as about $1/10$ of 0.010 part by weight, the resistivity can be increased.

On the other hand, Comparative Example 15, in which the Cu content was lower than 0.001 part by weight, exhibited a dielectric loss tangent of larger than 0.005 that was larger than in Examples 1 to 25.

Comparative Example 16, in which the Cu content was higher than 4.000 parts by weight, exhibited a dielectric loss tangent of larger than 0.005 that was larger than in Examples 1 to 25.

Preparation and Evaluation of Multilayer Piezoelectric Element

A multilayer Piezoelectric element according to an embodiment of the invention was prepared.

Example 27

Raw materials for the composition $(Ba_{0.920}Ca_{0.080})_{1.0017}(Ti_{0.930}Zr_{0.070})O_3$, which is a composition of general formula (1) $(Ba_{1-x}Ca_x)_a(Ti_{1-y}Zr_y)O_3$ in which x=0.080, y=0.070 and a=1.0017, were weighed out as below.

Raw material powders of barium titanate having a purity of 99.99% or more, calcium titanate having a purity of 99.99% or more, and calcium zirconate having a purity of 99.99% or more were prepared as the main constituent, and the raw material powders were weighed out so that the proportions of Ba, Ca, Ti and Zr satisfy the composition $(Ba_{0.920}Ca_{0.080})_{1.0017}(Ti_{0.930}Zr_{0.070})O_3$. In order to control the ratio a of the moles of Ba and Ca in the A site to the moles of Ti and Zr in the B site, barium carbonate and calcium carbonate were used.

Manganese dioxide was weighed out so that the content of the first sub-constituent Mn would be 0.150 part by weight in terms of metal element relative to 100 parts by weight of the composition $(Ba_{0.920}Ca_{0.080})_{1.0017}(Ti_{0.930}Zr_{0.070})O_3$.

Bismuth oxide was weighed out so that the content of the second sub-constituent Bi would be 0.260 part by weight in terms of metal element relative to 100 parts by weight of the composition $(Ba_{0.920}Ca_{0.080})_{1.0017}(Ti_{0.930}Zr_{0.070})O_3$.

Silicon dioxide and boron oxide were weighed out so that the contents of the third sub-constituents Si and B would be 0.033 part by weight and 0.017 part by weight respectively in terms of element relative to 100 parts by weight of the composition $(Ba_{0.920}Ca_{0.080})_{1.0017}(Ti_{0.930}Zr_{0.070})O_3$.

Copper (II) oxide was weighed out so that the content of the fourth sub-constituent Cu would be 0.479 part by weight in terms of metal element relative to 100 parts by weight of the composition $(Ba_{0.920}Ca_{0.080})_{1.0017}(Ti_{0.930}Zr_{0.070})O_3$.

The weighed powders were mixed together and PVB was added to the mixture. Then, the mixture was formed into 50 μm thick green sheets by a doctor blade method.

Inner electrodes were printed on the surfaces of the green sheets with a electroconductive paste. The electroconductive paste was Ag 70%-Pd 30% alloy (Ag/Pd=2.33) paste. Nine green sheets on which the electroconductive paste was applied were stacked to form a multilayer structure, and the multilayer structure was fired for sintering at 1200° C. for 4 hours.

The composition of the piezoelectric material portion of the resulting sintered structure was estimated by ICP emission spectroscopy. It was thus found that the piezoelectric material portion contained a metal oxide expressed by the chemical formula $(Ba_{0.920}Ca_{0.080})_{1.0017}(Ti_{0.930}Zr_{0.070})O_3$ as the main constituent, and further contained 0.150 part by weight of Mn in terms of metal element, 0.278 part by weight of Bi in terms of metal element, and 0.0010 part by weight of Mg in terms of metal element, each relative to 100 parts by weight of the main constituent. The Mg derived probably from the raw materials. The composition of the piezoelectric material portion corresponded to the proportions of the constituents Ba, Ca, Ti, Zr, Mn, Bi, Si, B and Cu weighed out.

The sintered structure was cut into a piece measuring 10 mm×2.5 mm, followed by polishing the side surfaces thereof. Then, a pair of external electrodes (first and second electrodes) were formed on the side surfaces by Au sputtering to electrically connect the inner electrodes alternately, thus producing a multilayer piezoelectric element as shown in FIG. 2B.

The multilayer piezoelectric element includes 9 piezoelectric material layers and 8 layers of inner electrodes. According to the observation of the inner electrodes in the resulting multilayer piezoelectric element, the Ag—Pd alloy layers of the electrodes were disposed alternately with the piezoelectric material layers.

Before the estimation of the piezoelectric properties, the sample was polarized. More specifically, the sample was heated to a temperature of 100° C. to 150° C. on a hot plate, and an electric field of 14 kV/cm was applied between the first electrode and the second electrode for 30 minutes. Then, the sample was cooled to room temperature with the electric field applied.

The estimation of the piezoelectric properties of the multilayer piezoelectric element showed that the sample exhibited insulation performance and piezoelectric properties equivalent to Example 1 even though it had a multilayer structure.

Also, multilayer piezoelectric elements produced in the same manner except that the inner electrodes were formed of Ni or Cu and sintered in an atmosphere with a low oxygen content exhibited equivalent piezoelectric properties.

Comparative Example 17

A multilayer piezoelectric element was prepared in the same manner as in Example 27. However, the composition was the same as in Comparative Example 11; the sintering temperature was 1300° C.; and the inner electrodes were formed of Ag 95%-Pd 5% alloy (Ag/Pd=19). The inner electrodes were observed through a scanning electron microscope. The inner electrodes were melted and scattered in an island manner. Since the inner electrodes did not have electrical continuity, polarization was impossible. The piezoelectric properties of the sample were therefore not estimated.

Comparative Example 18

A multilayer piezoelectric element was prepared in the same manner as in Comparative Example 17, except that the inner electrodes were formed of Ag 5%-Pd 95% alloy (Ag/Pd=0.05). The inner electrodes were observed through a scanning electron microscope. The Ag—Pd electrodes were not sufficiently sintered. Since the inner electrodes thus did not have electrical continuity, polarization was impossible. The piezoelectric properties of the sample were therefore not estimated.

Example 28

A liquid ejecting head shown in FIG. 3 was prepared using the piezoelectric element made of the piezoelectric material of Example 1. The liquid ejecting head ejected ink according to the electrical signal input. When the liquid ejecting head was operated using a non-aqueous ink in a thermostatic oven of 0° C., the liquid ejecting head ejected the ink with the same efficiency as and at a lower voltage than the case of operation at room temperature.

Example 29

A liquid ejecting apparatus shown in FIG. 4 was prepared using the liquid ejecting head of Example 28. The liquid ejecting apparatus ejected ink on a recording medium according to the electrical signal input. When the liquid ejecting apparatus was operated using a non-aqueous ink in a thermostatic oven of 0° C., the liquid ejecting apparatus ejected the ink on the recording medium with the same efficiency as and at a lower voltage than the case of operation at room temperature.

Example 30

An ultrasonic motor shown in FIG. 6A was prepared using the piezoelectric element made of the piezoelectric material of Example 1. It was confirmed that the ultrasonic motor rotated according to the alternating voltage applied.

When the ultrasonic motor was operated in a thermostatic oven of −30° C., the motor rotated with higher efficiency than the case of operation at room temperature.

Comparative Example 19

An ultrasonic motor shown in FIG. 6A was prepared using the comparative element of the metal oxide material of Comparative Example 9. When alternating voltages were applied to the element, the element rotated according the applied alternating voltage at room temperature. It however did not rotate in an thermostatic oven of −30° C. and when the alternative voltage was increased, only the power consumption was increased.

Example 31

An optical apparatus shown in FIG. 7 was prepared using the ultrasonic motor of Example 30. The optical apparatus exhibited autofocus operation according to the alternating voltage applied. When the optical apparatus was operated in a thermostatic oven of −30° C., the optical apparatus exhibited autofocus operation equivalent to the autofocus operation at room temperature.

Example 32

A dust removing unit shown in FIGS. 9A and 9B was prepared using the piezoelectric element made of the piezoelectric material of Example 1. Plastic beads were scattered and an alternating voltage was applied. The dust removing unit exhibited good dust removal. When the dust removing unit was operated in a thermostatic oven of −30° C., the unit exhibited more efficient dust removal than the case of operation at room temperature.

Example 33

An image sensing apparatus shown in FIG. 12 was prepared using the dust removing unit of Example 32. When the image sensing apparatus was operated, the dust on the surface of the image sensing unit was satisfactorily removed and images without defects resulting from dust were formed. When the image sensing apparatus was operated in a thermostatic oven of −30° C., the image sensing apparatus formed an image equivalent to images formed at room temperature.

Example 34

An electronic apparatus shown in FIG. 14 was prepared using the piezoelectric element of Example 1. The electronic apparatus performed loudspeaking operation according to the alternating voltage applied. When the electronic apparatus was operated in a thermostatic oven of −30° C., the electronic apparatus exhibited loudspeaking operation equivalent to the operation at room temperature.

Example 35

A liquid ejecting head shown in FIG. 3 was prepared using the multilayer piezoelectric element of Example 27. The liquid ejecting head ejected ink according to the electrical signal input. When the liquid ejecting head was operated using a non-aqueous ink in a thermostatic oven of 0° C., the liquid ejecting head ejected the ink with the same efficiency as and at a lower voltage than the case of operation at room temperature.

Example 36

A liquid ejecting apparatus shown in FIG. 4 was prepared using the liquid ejecting head of Example 35. The liquid ejecting apparatus ejected ink on a recording medium according to the electrical signal input. When the liquid ejecting apparatus was operated using a non-aqueous ink in a thermostatic oven of 0° C., the liquid ejecting apparatus ejected the ink on the recording medium with the same efficiency as and at a lower voltage than the case of operation at room temperature.

Example 37

An ultrasonic motor shown in FIG. 6B was prepared using the multilayer piezoelectric element of Example 27. It was confirmed that the ultrasonic motor rotated according to the alternating voltage applied. When the ultrasonic motor was operated in a thermostatic oven of −30° C., the motor rotated with higher efficiency than the case of operation at room temperature.

Example 38

An optical apparatus shown in FIG. 7 was prepared using the ultrasonic motor of Example 37. The optical apparatus exhibited autofocus operation according to the alternating voltage applied. When the optical apparatus was operated in a thermostatic oven of −30° C., the optical apparatus exhibited autofocus operation equivalent to the autofocus operation at room temperature.

Example 39

A dust removing unit shown in FIGS. 9A and 9B was prepared using the multilayer piezoelectric element of Example 27. Plastic beads were scattered and an alternating voltage was applied. The dust removing unit exhibited good dust removal. When the dust removing unit was operated in a thermostatic oven of −30° C., the unit exhibited more efficient dust removal than the case of operation at room temperature.

Example 40

An image sensing apparatus shown in FIG. 12 was prepared using the dust removing unit of Example 39. When the image sensing apparatus was operated, the dust on the surface of the image sensing unit was satisfactorily removed and images without defects resulting from dust were formed. When the image sensing apparatus was operated in a thermostatic oven of −30° C., the image sensing apparatus formed an image equivalent to images formed at room temperature.

Example 41

An electronic apparatus shown in FIG. 14 was prepared using the multilayer piezoelectric element of Example 27. The electronic apparatus performed loudspeaking operation according to the alternating voltage applied. When the electronic apparatus was operated in a thermostatic oven of −30° C., the electronic apparatus exhibited loudspeaking operation equivalent to the operation at room temperature.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

The piezoelectric material of an embodiment of the invention has a satisfactory piezoelectric constant and mechanical quality factor in the range of device operating temperatures (from −30° C. to 50° C.). In addition, the piezoelectric material does not contain lead, having low environmental load. The piezoelectric material of an embodiment of the invention can therefore be efficiently used for apparatuses or devices using piezoelectric materials, such as liquid ejecting heads, ultrasonic motors, and dust removing units.

The invention claimed is:
1. A piezoelectric material comprising:
a perovskite-type metal oxide expressed by the general formula $(Ba_{1-x}Ca_x)_a(Ti_{1-y}Zr_y)O_3$, wherein x, y and a satisfy $0.030 \leq x < 0.090$, $0.030 \leq y \leq 0.080$, and $0.9860 \leq a \leq 1.0200$;
a Mn component;
a Bi component, or a Bi and Li component;
a Cu component; and
a sub-constituent including at least one of Si and B;
wherein the Mn content is in the range of 0.040 part by weight to 0.500 part by weight in terms of metal element relative to 100 parts by weight of the metal oxide, the Bi content is in the range of 0.042 part by weight to 0.850 part by weight in terms of metal element relative to 100 parts by weight of the metal oxide, the Li content is in the range of 0 parts by weight to 0.028 part by weight in terms of metal element relative to 100 parts by weight of the metal oxide, the Cu content is in the range of 0.001 part by weight to 4.000 parts by weight in terms of metal element relative to 100 parts by weight of the metal oxide, and the content of the sub-constituent is in the range of 0.001 part by weight to 4.000 parts by weight in terms of element relative to 100 parts by weight of the metal oxide.

2. The piezoelectric material according to claim 1, further comprising a Mg component with a content in the range of more than 0 parts by weight to 0.10 part by weight in terms of metal element relative to 100 parts by weight of the perovskite-type metal oxide.

3. The piezoelectric material according to claim 1, wherein crystal grains of the piezoelectric material have an average equivalent circular diameter in the range of 500 nm to 10 μm.

4. The piezoelectric material according to claim 1, wherein the piezoelectric material has a relative density in the range of 93% to 100%.

5. The piezoelectric material according to claim 1, wherein the piezoelectric material exhibits a dielectric loss tangent of 0.005 or less when an alternating voltage having a frequency of 1 kHz is applied.

6. A piezoelectric element comprising:
a first electrode;
a piezoelectric material portion; and
a second electrode,
wherein the piezoelectric material portion is made of the piezoelectric material as set forth in claim 1.

7. A multilayer piezoelectric element comprising:
a plurality of piezoelectric material layers, each made of the piezoelectric material as set forth in claim 1; and
a plurality of electrode layers including at least one inner electrode,
wherein the piezoelectric material layers and the electrode layers are alternately stacked on each other.

8. The multilayer piezoelectric element according to claim 7, wherein the inner electrode contains Ag with a content M1 on a weight basis and Pd with a content M2 on a weight basis, and the ratio of the Ag content M1 to the Pd content M2 satisfies the relationship $0.25 \leq M1/M2 \leq 4.0$.

9. The multilayer piezoelectric element according to claim 7, wherein the inner electrode contains at least one of Ni and Cu.

10. A liquid ejecting head comprising:
a liquid chamber provided with a vibration portion including the piezoelectric element according to claim 6; and
a portion defining an ejection opening communicating with the liquid chamber.

11. A liquid ejecting apparatus comprising:
a portion on which a transfer medium is placed; and
the liquid ejecting head according to claim 10.

12. An ultrasonic motor comprising:
a vibration device including the piezoelectric element according to claim 6; and
a moving device in contact with the vibration device.

13. An optical apparatus comprising a driving portion including the ultrasonic motor according to claim 12.

14. A vibration unit comprising:
the piezoelectric element according to claim 6; and
a diaphragm on which the piezoelectric element or the multilayer piezoelectric element is disposed.

15. A dust removing unit comprising a vibration portion including the vibration unit according to claim 14.

16. An image sensing apparatus comprising:
the dust removing unit according to claim 15; and
an image sensing element unit having a light-receiving face,
wherein the dust removing unit is disposed at the light-receiving face.

17. A piezoelectric acoustic component including the piezoelectric element according to claim 6.

18. A liquid ejecting head comprising:
a liquid chamber provided with a vibration portion including the multilayer piezoelectric element according to claim 7; and
a portion defining an ejection opening communicating with the liquid chamber.

19. A liquid ejecting apparatus comprising:
a portion on which a transfer medium is placed; and
the liquid ejecting head according to claim 18.

20. An ultrasonic motor comprising:
a vibration device including the multilayer piezoelectric element according to claim 7; and
a moving device in contact with the vibration device.

21. An optical apparatus comprising a driving portion including the ultrasonic motor according to claim 20.

22. A vibration unit comprising:
the multilayer piezoelectric element according to claim 7; and
a diaphragm on which the piezoelectric element or the multilayer piezoelectric element is disposed.

23. A dust removing unit comprising a vibration portion including the vibration unit according to claim 22.

24. An image sensing apparatus comprising:
the dust removing unit according to claim 23; and
an image sensing element unit having a light-receiving face,
wherein the dust removing unit is disposed at the light-receiving face.

25. A piezoelectric acoustic component including the multilayer piezoelectric element according to claim 7.

26. An electronic apparatus comprising the piezoelectric element according to claim 6.

27. An electronic apparatus comprising the multilayer piezoelectric element according to claim 7.

* * * * *